United States Patent
Heinecke et al.

(10) Patent No.: US 12,423,102 B2
(45) Date of Patent: Sep. 23, 2025

(54) INSTRUCTIONS TO CONVERT FROM FP16 TO BF8

(71) Applicant: Intel Corporation, Santa Clara, CA (US)

(72) Inventors: Alexander Heinecke, San Jose, CA (US); Naveen Mellempudi, Bangalore (IN); Robert Valentine, Kiryat Tivon (IL); Mark Charney, Lexington, MA (US); Christopher Hughes, Santa Clara, CA (US); Evangelos Georganas, San Mateo, CA (US); Zeev Sperber, Zichron Yackov (IL); Amit Gradstein, Binyamina (IL); Simon Rubanovich, Haifa (IL)

(73) Assignee: Intel Corporation, Santa Clara, CA (US)

( * ) Notice: Subject to any disclaimer, the term of this patent is extended or adjusted under 35 U.S.C. 154(b) by 919 days.

(21) Appl. No.: 17/134,353

(22) Filed: Dec. 26, 2020

(65) Prior Publication Data

US 2022/0206805 A1 Jun. 30, 2022

(51) Int. Cl.
*G06F 9/30* (2018.01)
*G06F 7/49* (2006.01)
(Continued)

(52) U.S. Cl.
CPC ...... *G06F 9/30145* (2013.01); *G06F 7/49947* (2013.01); *G06F 9/30025* (2013.01);
(Continued)

(58) Field of Classification Search
None
See application file for complete search history.

(56) References Cited

U.S. PATENT DOCUMENTS 5,673,407 A * 9/1997 Poland ............... G06F 9/30167
712/7
5,761,103 A * 6/1998 Oakland ............... G06F 7/483
708/497
(Continued)

FOREIGN PATENT DOCUMENTS

CN 111401536 A 7/2020
EP 1080421 B1 * 5/2002 ......... G06F 9/30014
(Continued)

OTHER PUBLICATIONS

Kusswurm 'Modern Arm Assembly Language Programming' Published Oct. 8, 2020. (Year: 2020).*
(Continued)

*Primary Examiner* — Steven G Snyder
(74) *Attorney, Agent, or Firm* — Nicholson De Vos Webster & Elliott LLP

(57) ABSTRACT

Techniques for converting FP16 data elements to BF8 data elements using a single instruction are described. An exemplary apparatus includes decoder circuitry to decode a single instruction, the single instruction to include a one or more fields to identify a source operand, one or more fields to identify a destination operand, and one or more fields for an opcode, the opcode to indicate that execution circuitry is to convert packed half-precision floating-point data from the identified source to packed bfloat8 data and store the packed bfloat8 data into corresponding data element positions of the identified destination operand; and execution circuitry to execute the decoded instruction according to the opcode to convert packed half-precision floating-point data from the identified source to packed bfloat8 data and store the packed bfloat8 data into corresponding data element positions.

18 Claims, 22 Drawing Sheets

(51) Int. Cl.
    *G06F 7/499* (2006.01)
    *H03M 7/24* (2006.01)
(52) U.S. Cl.
    CPC ...... *G06F 9/30036* (2013.01); *G06F 9/30038* (2023.08); *H03M 7/24* (2013.01)

(56) References Cited

U.S. PATENT DOCUMENTS

| | | | | |
|---|---|---|---|---|
| 7,444,367 | B2* | 10/2008 | Steele, Jr. | G06F 7/4876 |
| | | | | 712/E9.02 |
| 8,667,250 | B2* | 3/2014 | Sprangle | G06F 9/30036 |
| | | | | 712/4 |
| 11,372,643 | B2* | 6/2022 | Heinecke | G06F 9/30018 |
| 11,556,615 | B2* | 1/2023 | Das Sarma | G06N 3/045 |
| 2002/0178204 | A1* | 11/2002 | Steele, Jr. | G06F 9/30014 |
| | | | | 712/E9.02 |
| 2002/0184282 | A1 | 12/2002 | Yuval et al. | |
| 2011/0173421 | A1* | 7/2011 | Chen | G06F 7/485 |
| | | | | 712/222 |
| 2016/0062954 | A1 | 3/2016 | Ruff et al. | |
| 2016/0179515 | A1* | 6/2016 | San Adrian | G06F 9/4552 |
| | | | | 712/221 |
| 2019/0079762 | A1* | 3/2019 | Heinecke | G06F 9/3802 |
| 2019/0294964 | A1* | 9/2019 | Ouchi | G06N 3/084 |
| 2020/0348909 | A1* | 11/2020 | Das Sarma | G06N 3/063 |
| 2020/0349216 | A1* | 11/2020 | Das Sarma | G06F 7/5443 |
| 2021/0124580 | A1* | 4/2021 | Heinecke | G06F 9/384 |
| 2022/0206743 | A1* | 6/2022 | Heinecke | G06F 9/30036 |
| 2022/0318013 | A1* | 10/2022 | Mellempudi | G06F 9/3893 |
| 2024/0045677 | A1* | 2/2024 | Heinecke | G06F 9/3016 |
| 2024/0045684 | A1* | 2/2024 | Heinecke | G06F 9/30145 |
| 2024/0045686 | A1* | 2/2024 | Heinecke | G06F 9/30025 |
| 2024/0045691 | A1* | 2/2024 | Mellempudi | G06F 7/4876 |

FOREIGN PATENT DOCUMENTS

| | | | | |
|---|---|---|---|---|
| EP | 3798827 A1 * | 3/2021 | ......... | G06F 9/30014 |
| EP | 4020169 A1 * | 6/2022 | ......... | G06F 7/49915 |
| EP | 4020178 A1 * | 6/2022 | ............. | G06F 5/00 |
| EP | 4020184 A1 * | 6/2022 | ......... | G06F 7/49947 |
| EP | 4064040 A1 * | 9/2022 | ......... | G06F 9/30014 |
| EP | 4273694 A2 * | 11/2023 | ......... | G06F 9/30014 |
| EP | 4276608 A2 * | 11/2023 | ......... | G06F 9/30014 |
| EP | 4318229 A1 * | 2/2024 | ......... | G06F 9/30018 |
| WO | WO-9961997 A1 * | 12/1999 | ......... | G06F 9/30014 |

OTHER PUBLICATIONS

Devnath et al. 'A Mathematical Approach Towards Quantization of Floating Point Weights in Low Power Neural Networks' 2020 33rd International Conference on VLSI Design and 2020 19th International Conference on Embedded Systems (VLSID), Jan. 2020. (Year: 2020).*
Wu et al., 'Phoenix: A Low-Precision Floating-Point Quantization Oriented Architecture for Convolutional Neural Networks' Feb. 29, 2020. (Year: 2020).*
"Special Case" Arithmetic Handling For IEEE Floating Point Hardware' NN8905469, May 1, 1989. (Year: 1989).*
Machine Translation of Chinese Patent Application CN 116795324 A, Sep. 22, 2023. (Year: 2023).*
Machine Translation of Chinese Patent Application CN 111401536 A, Jul. 10, 2020. (Year: 2020).*
Machine Translation of Chinese Patent Application CN 105634499 A, Jun. 1, 2016. (Year: 2016).*
Office Action, EP App. No. 21198815.9, Jan. 17, 2023, 7 pages.
European Search Report and Search Opinion, EP App. No. 21198815.9, Mar. 18, 2022, 9 pages.
Extended European Search Report and Search Opinion, EP App. No. 23199193.6, Dec. 21, 2023, 10 pages.
Office Action, EP App. No. 21198815.9, Nov. 27, 2023, 8 pages.

* cited by examiner

FETCH A SINGLE INSTRUCTION AT LEAST HAVING ONE OR MORE FIELDS TO IDENTIFY A SOURCE OPERAND, ONE OR MORE FIELDS TO IDENTIFY A DESTINATION OPERAND, AND ONE OR MORE FIELDS FOR AN OPCODE, THE OPCODE TO INDICATE THAT EXECUTION CIRCUITRY IS TO CONVERT PACKED HALF-PRECISION DATA FROM THE IDENTIFIED SOURCE TO PACKED BFLOAT8 DATA AND STORE THE PACKED BFLOAT8 DATA INTO CORRESPONDING DATA ELEMENT POSITIONS OF THE IDENTIFIED DESTINATION OPERAND 401

TRANSLATE THE FETCHED INSTRUCTION INTO ONE OR MORE INSTRUCTIONS 402

DECODE THE INSTRUCTION (OR TRANSLATED ONE OR MORE INSTRUCTIONS) 403

RETRIEVE DATA ASSOCIATED WITH THE SOURCE OPERAND AND SCHEDULE 405

EXECUTE THE DECODED SINGLE INSTRUCTION (OR TRANSLATED ONE OR MORE INSTRUCTIONS) TO CONVERT PACKED HALF-PRECISION DATA FROM THE IDENTIFIED SOURCE TO PACKED BFLOAT8 DATA AND STORE THE PACKED BFLOAT8 DATA INTO CORRESPONDING DATA ELEMENT POSITIONS OF THE IDENTIFIED DESTINATION OPERAND 407

COMMIT A RESULT OF THE EXECUTED INSTRUCTION 409

FIG. 4

```
VCVTNEPH2BF8 dest, src
VL = (128, 256, 512)
KL = VL/8 origdest := dest
for i := 0 to KL/2-1:
    if k1[i] or *no writemask*:
        if src is memory and evex.b == 1:
            t := src.fp16[0]
        else:
            t := src.fp16[i]
        dest.byte[i] := convert_fp16_to_bfloat8(t)
    else if *zeroing*:
        dest.byte[i] := 0
    else: // merge masking, dest element unchanged
        dest.byte[i] := origdest.byte[i]
dest[max_vl-1 : vl/2] := 0 define convert_fp16_to_bfloat8(t)
    if x is infinity:
        dest[7:0] := x[15:8]
    else if x is not-a-number (NAN)
        dest[7:0] := x[15:8] // truncate and set most sig bit of the mantissa to force QNAN
        dest[1] := 1
    else // normal number, zero, or denormal
        lsb := x[8] // lsb is least significant bit
        rounding_bias := 0x007F + lsb
        temp[15:0] := x[15:0] + rounding_bias (integer add)
        dest[7:0] := temp[15:8]
return dest
```

FIG. 6

FETCH AN INSTRUCTION AT LEAST HAVING ONE OR MORE FIELDS TO IDENTIFY A FIRST SOURCE OPERAND, ONE OR MORE FIELDS TO IDENTIFY A SECOND SOURCE OPERAND, ONE OR MORE FIELDS TO IDENTIFY A DESTINATION OPERAND, AND ONE OR MORE FIELDS FOR AN OPCODE, WHEREIN THE OPCODE IS TO INDICATE THAT EXECUTION CIRCUITRY IS TO CONVERT PACKED HALF-PRECISION DATA FROM THE IDENTIFIED FIRST AND SECOND SOURCES TO PACKED BFLOAT8 DATA AND STORE THE PACKED BFLOAT8 DATA INTO CORRESPONDING DATA ELEMENT POSITIONS OF THE IDENTIFIED DESTINATION OPERAND 701

TRANSLATE THE FETCHED INSTRUCTION INTO ONE OR MORE INSTRUCTIONS 702

DECODE THE INSTRUCTION 703

RETRIEVE DATA ASSOCIATED WITH THE SOURCE OPERANDS AND SCHEDULE 705

EXECUTE THE DECODED INSTRUCTION TO CONVERT PACKED HALF-PRECISION DATA FROM THE IDENTIFIED FIRST AND SECOND SOURCES TO PACKED BFLOAT8 DATA AND STORE THE PACKED BFLOAT8 DATA INTO CORRESPONDING DATA ELEMENT POSITIONS OF THE IDENTIFIED DESTINATION OPERAND 707

COMMIT A RESULT OF THE EXECUTED INSTRUCTION 709

FIG. 7

```
VCVTNE2PH2BF8 dest, src
VL = (128, 256, 512)
KL = VL/8 origdest := dest
for i := 0 to KL-1:
    if k1[i] or *no writemask*:
        if i < KL/2:
            if src2 is memory and evex.b == 1:
                t := src2.fp16[0]
            else:
                t := src2.fp16[i]
        else:
            t := src1.fp16[i-KL/2]

dest.byte[i] := convert_fp16_to_bfloat8(t)

else if *zeroing*:
        dest.byte[i] := 0
    else: // merge masking, dest element unchanged
        dest.byte[i] := origdest.byte[i]

define convert_fp16_to_bfloat8(t)
    if x is infinity:
        dest[7:0] := x[15:8]
    else if x is not-a-number (NAN)
        dest[7:0] := x[15:8] // truncate and set most sig bit of the mantissa to force QNAN
        dest[1] = 1
    else // normal number, zero, or denormal
        lsb := x[8] // lsb is least significant bit
        rounding_bias := 0x007F + lsb
        temp[15:0] := x[15:0] + rounding_bias // integer add
        dest[7:0] := temp[15:8]
return dest
```

FIG. 9

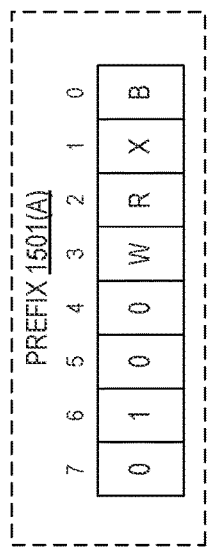
FIG. 17
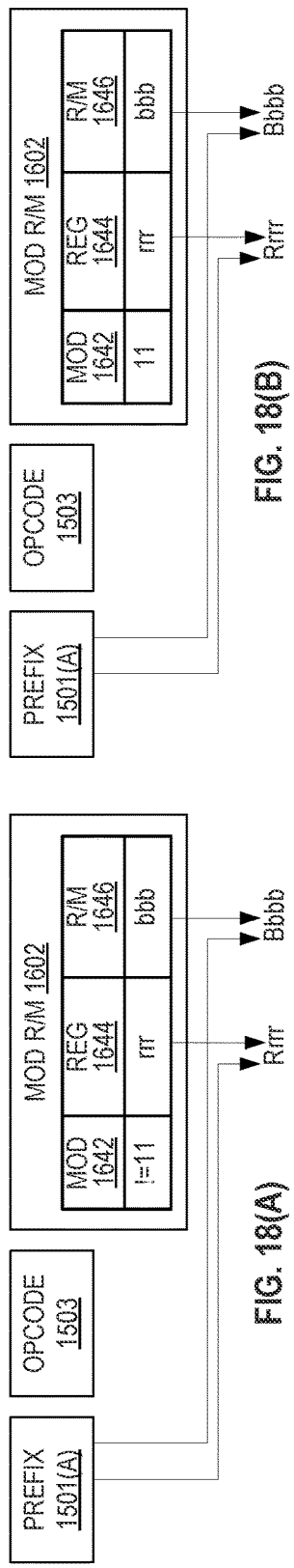
FIG. 18(A)
FIG. 18(B)
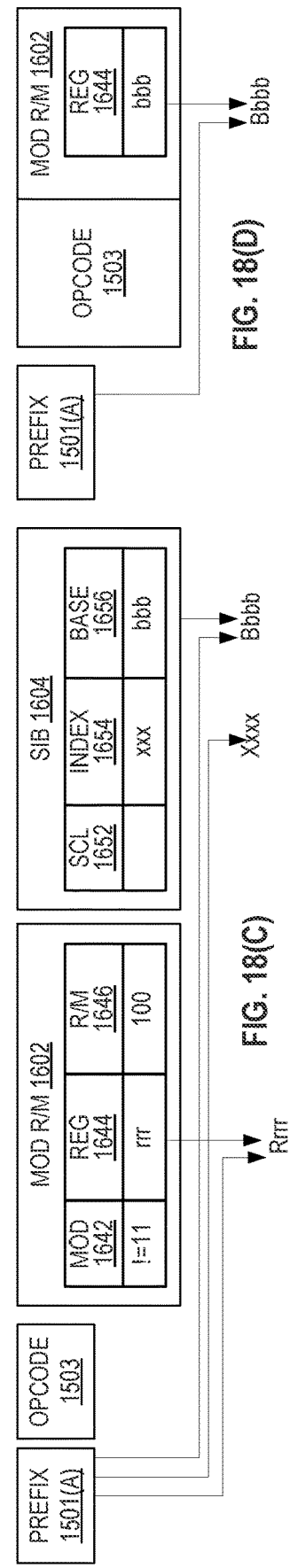
FIG. 18(C)
FIG. 18(D)

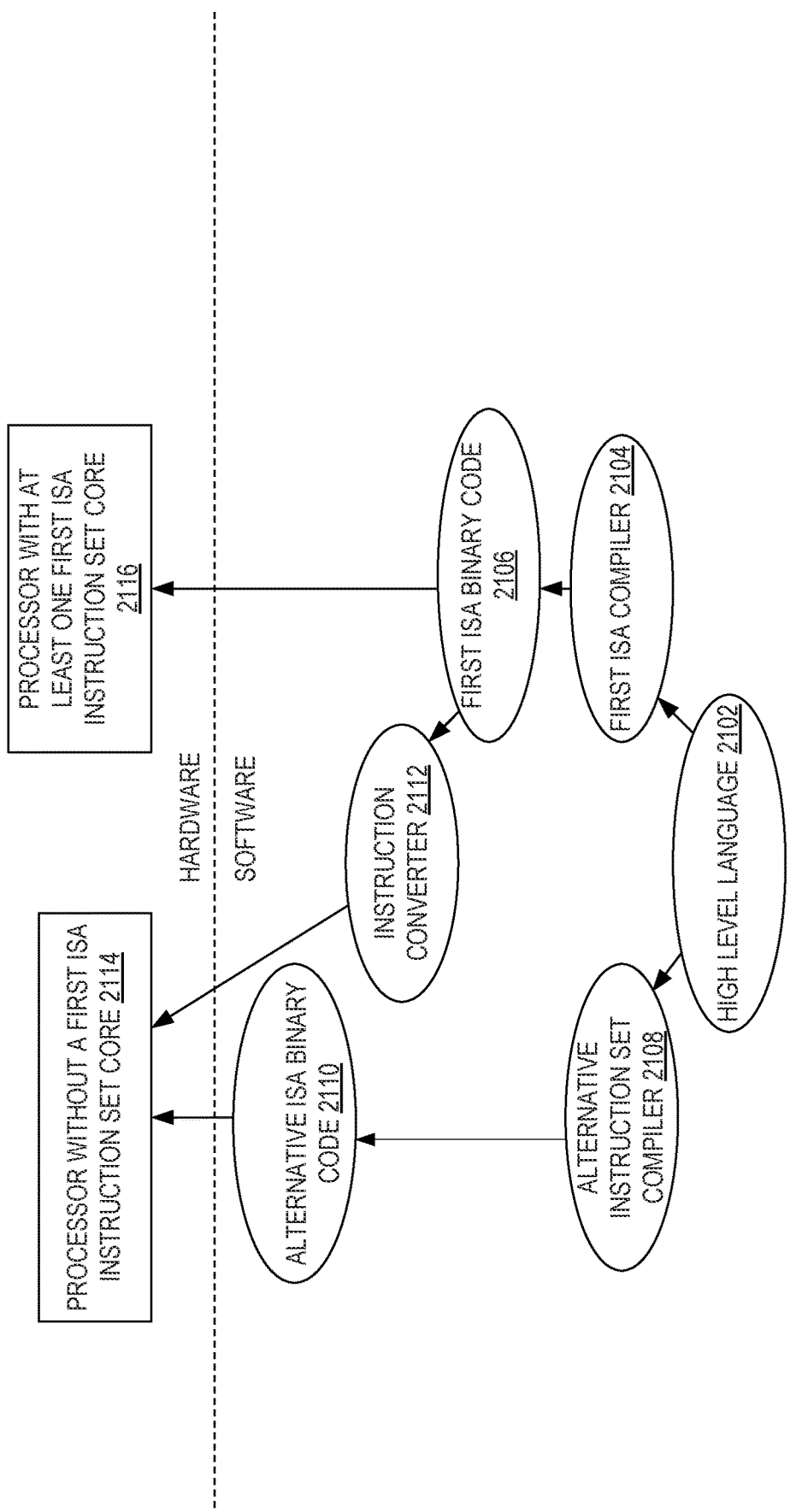

INSTRUCTIONS TO CONVERT FROM FP16 TO BF8

BACKGROUND

State of the art AI uses different 32-bit and 16-bit floating point formats such as, for example, Brain floating point 16 (also known as, for example, bloat16 or BF16), Institute of Electrical and Electronics Engineers (IEEE) half-precision floating point (also known as, for example, FP16 or float16) and single-precision floating point (also known as, for example, FP32 or float32). Recent work has also shown that 8-bit float point formats, such as bfloat8 (using a 1-5-2 format (1-bit sign, 5-bit exponent, and 2-bit mantissa), are a viable option for input data for mixed precision computation such as fused multiply-add (FMA) with BF8 inputs and a FP32 accumulator.

BRIEF DESCRIPTION OF DRAWINGS

Various embodiments in accordance with the present disclosure will be described with reference to the drawings, in which:

FIG. 4 illustrates an embodiment of method performed by a processor to process a VCVTNEPH2BF8 instruction.

FIG. 6 illustrates embodiments of pseudocode for performing the VCVTNEPH2BF8 instruction.

FIG. 7 illustrates an embodiment of method performed by a processor to process a VCVTNE2PH2BF8 instruction.

FIG. 9 illustrates embodiments of pseudocode for performing the VCVTNE2PH2BF8 instruction.

FIG. 17 illustrates embodiments of a first prefix.

FIGS. 18(A)-(D) illustrate embodiments of how some fields of the first prefix are used.

FIG. 21 illustrates a block diagram contrasting the use of a software instruction converter to convert binary instructions in a source instruction set to binary instructions in a target instruction set according to embodiments of the invention.

DETAILED DESCRIPTION

Figure 1:
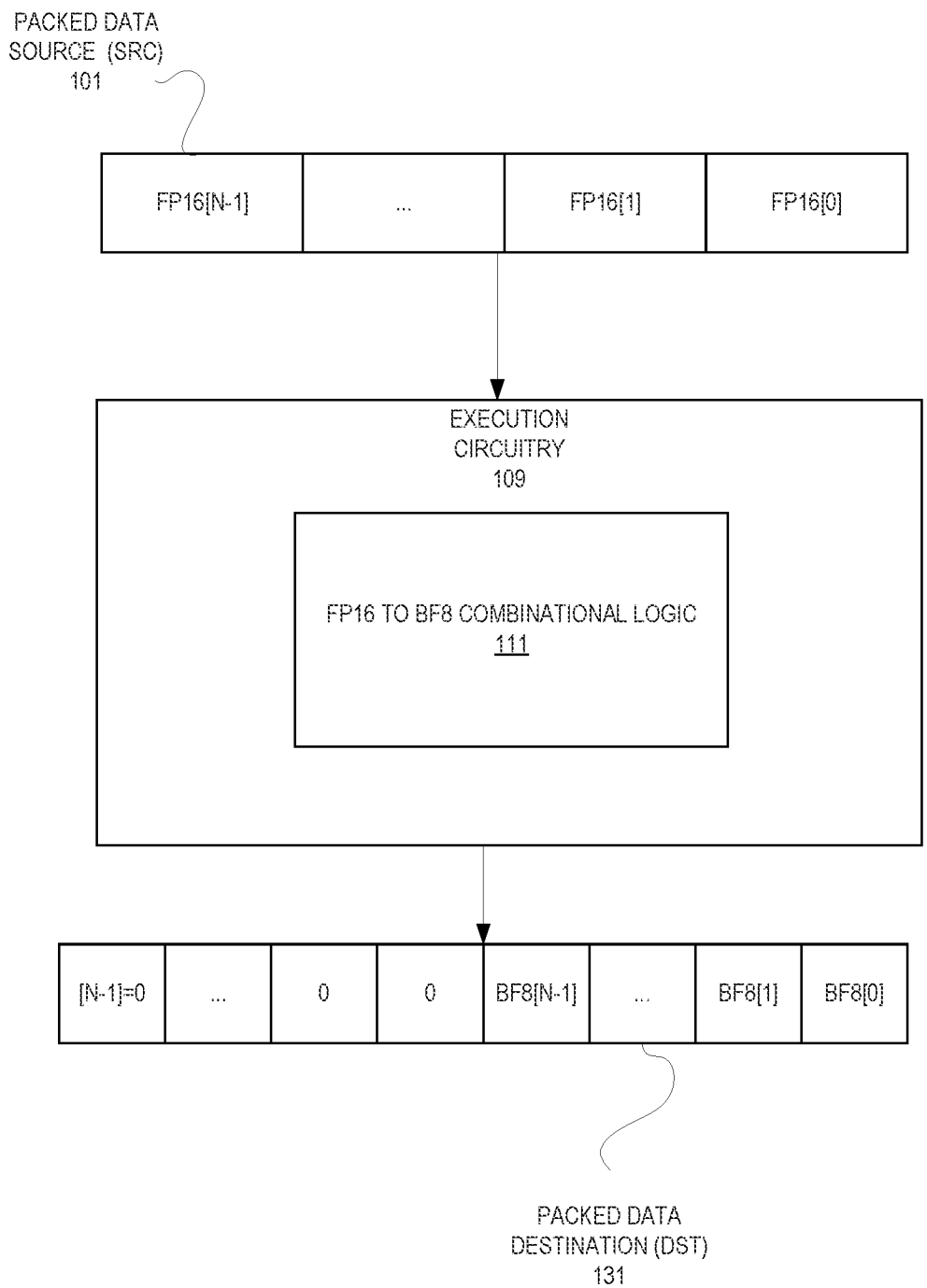
FIG. 1 illustrates an exemplary execution of a VCVTNEPH2BF8 instruction.

The present disclosure relates to methods, apparatus, systems, and non-transitory computer-readable storage media for performing a conversion from half-precision floating point to bfloat8 in response to a single instruction. To prepare higher-precision outputs to be used as the next operation's inputs, in some embodiments, those outputs need to be converted/rounded to BF8 numbers. Using 8-bit floating-point format instead of single-precision in at least some matrix operations is expected to alleviate memory utilization and bandwidth issues while providing a non-trivial performance upside (e.g., on the order of 2×) even during the compute operation. Additionally, numerical accuracy studies have shown that the precision of the Deep Learning application is not compromised.

Current experiments show bandwidth issues on the various cache levels and DRAM. So, as matrix compute capabilities speed up significantly (2×), the memory sub-systems capabilities only increase modestly due to reduce memory footprint. However, it has been found important to achieve convergence that FMAs accumulate into single-precision, IEEE FP32. That means it may be important down-convert a result to BF8 after the operation completes.

Some processors offer FP16 compute and int8/int16 compute stacks. To convert a number from IEEE FP16 to BF8 requires the detour via various int8/int8 instructions as the nearest even rounding can be implemented this way, however its execution is very slow.

Embodiments detailed herein describe instructions and instructional support for performing this conversion/rounding using a round to nearest even approach. In particular, a FP16 value is converted/rounded to a BF8 value. In particular, embodiments of two instructions to convert from FP16 to BF8 are detailed. One or more of these instructions, when executed, convert one/two vector(s) (up to 32 16-bit elements in a 512-bit register) to 8-bit BF8. Hardware-assisted conversion may also afford the opportunity to "hide" the conversion infrastructure from software (SW) and the operating system (OS), for example, by performing arithmetic on a converted vector while converting the next vector.

Execution of embodiments of a first instruction is to cause a conversion, using IEEE nearest even rounding, of a plurality of packed FP16 values in a packed data source operand (e.g., a SIMD/packed data/vector register or memory location) having a plurality of FP16 data elements) to a plurality of packed BF8 values and store those values in a packed data destination operand (e.g., a SIMD/packed data/vector register or memory location). In some embodiments, as the packed data elements of the source are larger than the packed data elements of the destination, the upper half of the destination is zeroed. In some embodiments, the instruction format utilizes a writemask or predicate, which is used to determine which data element positions of the destination are to be updated, zeroed, etc.

As such, a processor or core implementing the first instruction will execute according to the opcode of the first instruction a conversion of each of the elements of the source from FP16 to BF8 and store each converted element into a corresponding data element position of the specified destination vector. In some embodiments, the conversion is to include truncation and rounding, as necessary. The remaining data element positions will be zeroed.

In some embodiments, the first FP16 to BF8 conversion instruction has a mnemonic of VCVTNEPH2BF8 where VCVT indicates a convert, NE indicates nearest even (using the IEEE rounding format), PH indicates packed FP16, 2 indicates "to", and BF8 indicates the 1-5-2 version of BF8. An embodiment of a format for the first FP16 to BF8 conversion instruction is VCVTNEPH2BF8{k1} DST, SRC. In some embodiments, VCVTNEPH2BF8 is the opcode mnemonic of the instruction. DST indicates the packed data destination operand location and SRC indicates a packed data source operand location. Exemplary operand sizes include, but are not limited to 64-bit, 128-bit, 256-bit, 512-bit, and 1024-bit. For example, SRC and DST may be 512-bit registers, where the SRC is to store 32 FP16 elements and the DST has storage for 64 BF8 elements, but will only utilize 32 of those elements (the rest will be zeroed). Note that in some embodiments, VCVTNEPH2BF8 converts uses different size operands (for example, 512-bit source and 256-bit destination, or 256-bit source and 128-bit destination).

In some embodiments, k1 indicates the use of writemasking/predication. One or more of the operands may be a memory location. In some embodiments, the destination is encoded using one or more fields for ModRM:reg(w) and the source is encoded using one or more fields for ModRM:r/m(r). In some embodiments, the instruction uses prefix 1501(C).

FIG. 1 illustrates an exemplary execution of a VCVTNEPH2BF8 instruction. While this illustration is in little endian format, the principles discussed herein work in big endian format. In this example, writemasking/predication is not used.

As shown, a packed data source 101 includes N FP16 elements. Depending upon the implementation, packed data source 1 101 is a packed data register (e.g., a XMM, YMM, ZMM, vector, SIMD, etc. register), or a memory location.

The packed data source 101 is fed into execution circuitry 109 to be operated on. In particular, execution circuitry 109 performs the FP16 to BF8 conversion using FP16 to BF8 combinational logic 111. Details of embodiments of operations of that combinational logic 111 are described as flow diagrams later.

Packed data destination 131 stores the results of the conversions of the FP16 data elements of packed data source 101 in corresponding positions of the packed data destination 131. For example, packed data source position 0 (far right) is stored in packed data destination position 0 (far right). While N packed data element conversions are to be stored in the packed data destination 131, the remaining elements of the packed data destination 131 are zeroed (as shown).

Execution of embodiments of a second instruction is to cause a conversion, using IEEE nearest even rounding, of a plurality of packed FP16 values in two packed data source operands (e.g., a SIMD/packed data/vector registers or a memory location) having a plurality of FP16 data elements) to a plurality of packed BF8 values and store those values in a packed data destination operand (e.g., a SIMD/packed data/vector register or memory location). In some embodiments, the instruction format utilizes a writemask or predicate, which is used to determine which data element positions of the destination are to be updated, zeroed, etc.

As such, a processor or core implementing the second instruction will execute according to the opcode of the first instruction a conversion of each of the elements of the sources from FP16 to BF8 and store each converted element into a corresponding data element position of the specified destination vector. Note that the two sources are treated as being one large source for the purposes of data element positions. For example, for 512-bit sources a first of the sources has data element positions 0-15 and the second of the sources has data element positions 15-31 with respect to the destination. In some embodiments, the conversion is to include truncation and rounding, as necessary.

In some embodiments, the first FP16 to BF8 conversion instruction has a mnemonic of VCVTNE2PH2BF8 where VCVT indicates a convert, NE indicates nearest even (using the IEEE rounding format), 2PH indicates two packed FP16 sources, 2 indicates "to", and BF8 indicates the 1-5-2 version of BF8. An embodiment of a format for the second FP16 to BF8 conversion instruction is VCVTNE2PH2BF8{k1} DST, SRC1, SR2. In some embodiments, VCVTNEPH2BF8 is the opcode mnemonic of the instruction. DST indicates the packed data destination operand location and SRC1 and SRC2 indicate packed data source operand locations. Exemplary operand sizes include, but are not limited to 64-bit, 128-bit, 256-bit, 512-bit, and 1024-bit. For example, SRC1, SRC2, and DST may be 512-bit registers, where the SRC1 and SRC2 are to store 32 FP16 elements and the DST has storage for 64 BF8 elements. A benefit of VCVTNE2PH2BF8 is that the register space and cache ports are used efficiently as to max out their corresponding widths in some embodiments.

In some embodiments, k1 indicates the use of writemasking/predication. One or more of the operands may be a memory location. In some embodiments, the destination is encoded using one or more fields for ModRM:reg(w), the first source is encoded using one more fields from a prefix (e.g., vvvv(r)), and the second source is encoded using one or more fields for ModRM:r/m(r). In some embodiments, the instruction uses prefix 1501(C).

Figure 2:
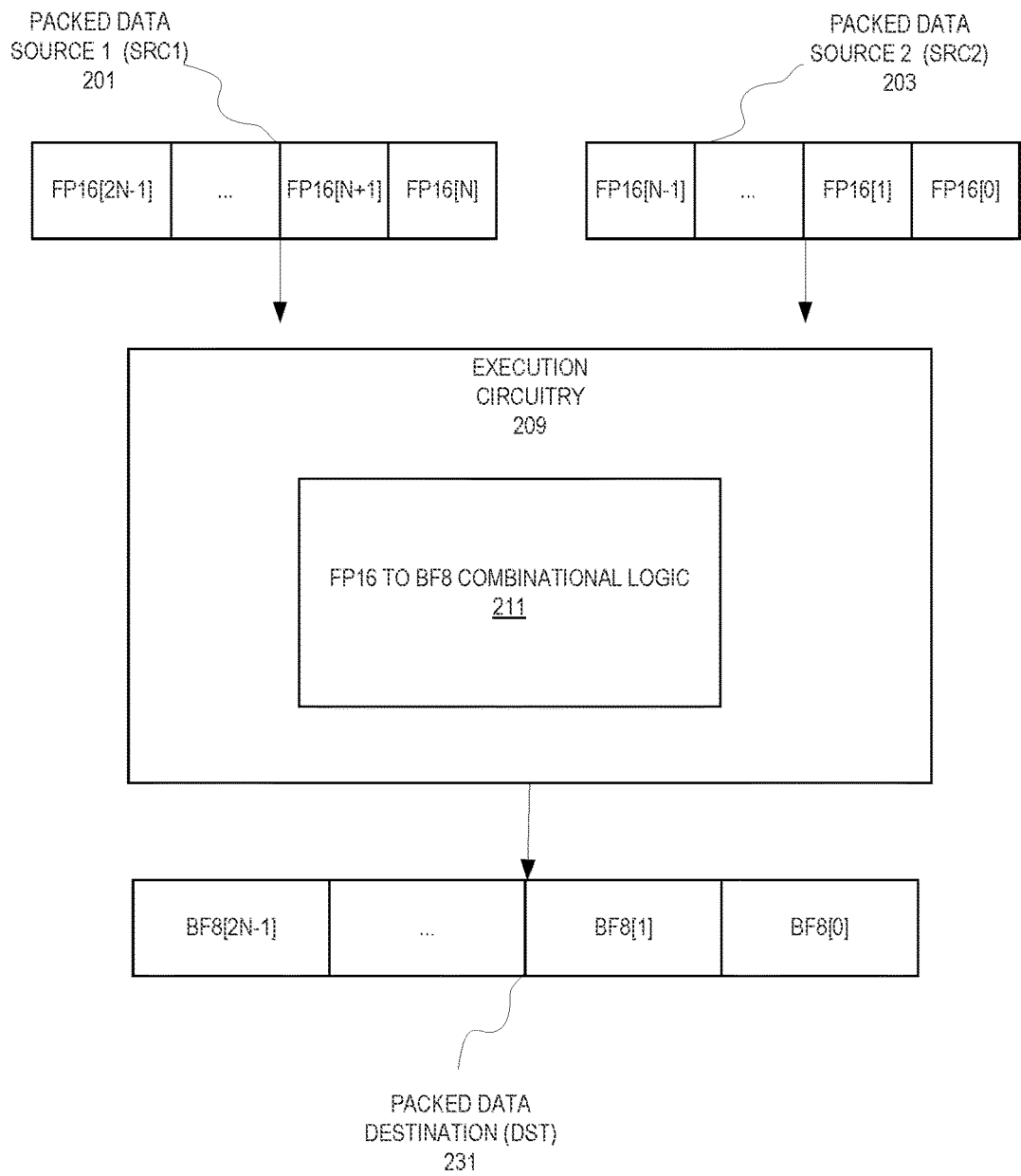
FIG. 2 illustrates an exemplary execution of a VCVTNE2PH2BF8 instruction.

FIG. 2 illustrates an exemplary execution of a VCVTNE2PH2BF8 instruction. While this illustration is in little endian format, the principles discussed herein work in big endian format. In this example, writemasking/predication is not used.

As shown, each of the packed data sources 201 and 203 include N FP16 elements. Depending upon the implementation, the packed data source 1 201 and packed data source 2 203 are a packed data register (e.g., a XMM, YMM, ZMM, vector, SIMD, etc. register), or a memory location.

The packed data source 201 is fed into execution circuitry 209 to be operated on. In particular, execution circuitry 209 performs the FP16 to BF8 conversion using FP16 to BF8 combinational logic 211. Details of embodiments of operations of that combinational logic 211 are described as flow diagrams later.

Packed data destination 231 stores the results of the conversions of the FP16 data elements of packed data sources 201 and 203 in corresponding positions of the packed data destination 231. For example, packed data source position 0 (far right) of packed data source 2 203 is stored in packed data destination position 0 (far right). While the most significant packed data element position of packed data source 1 201 is stored in the most significant packed data element position of the packed data destination 231.

Figure 3:
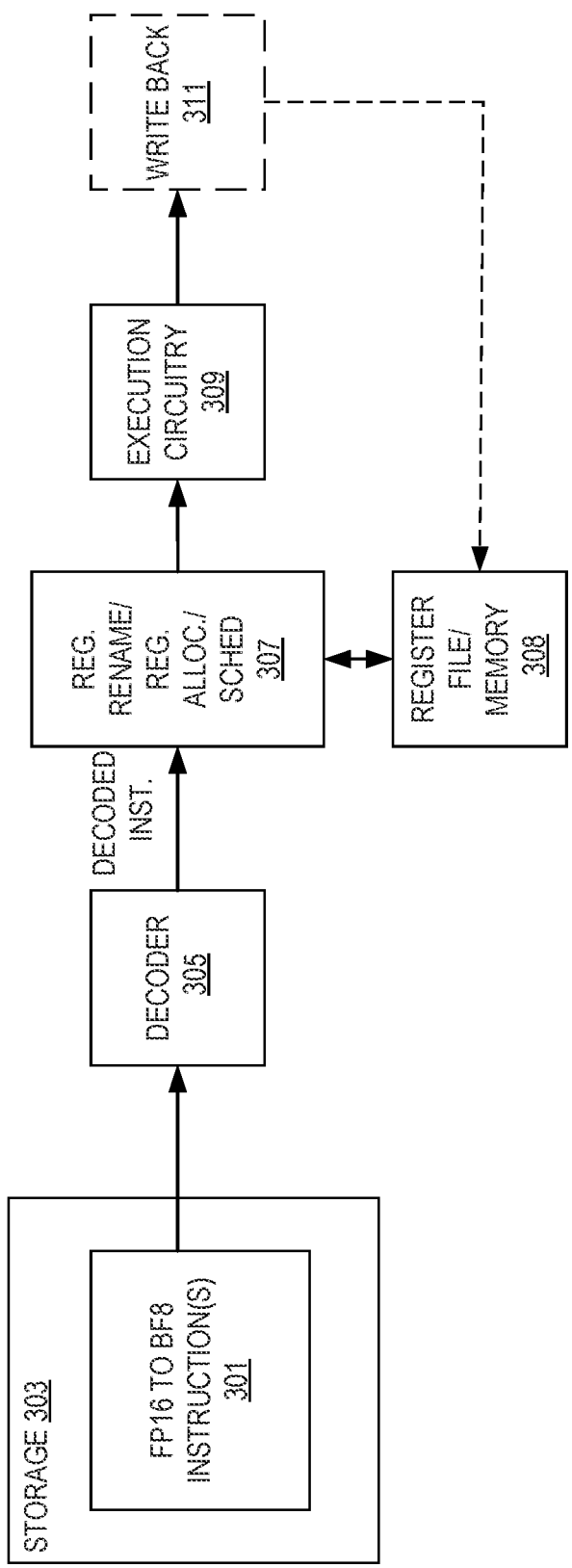
FIG. 3 illustrates embodiments of hardware to process an instruction such as the FP16 to BF8 (e.g., VCVTNE2PH2BF8 and VCVTNEPH2BF8) instructions.

FIG. 3 illustrates embodiments of hardware to process an instruction such as the FP16 to BF8 (e.g., VCVTNE2PH2BF8 and VCVTNEPH2BF8) instructions. As illustrated, storage 303 stores a VCVTNE2PH2BF8 and/or VCVTNEPH2BF8 instruction 301 to be executed.

The instruction 301 is received by decode circuitry 305. For example, the decode circuitry 305 receives this instruction from fetch logic/circuitry. The instruction includes fields for an opcode, first and second sources, and a destination. In some embodiments, the sources and destination are registers, and in other embodiments one or more are memory locations. In some embodiments, the opcode details which arithmetic operation is to be performed.

More detailed embodiments of at least one instruction format will be detailed later. The decode circuitry 305 decodes the instruction into one or more operations. In some embodiments, this decoding includes generating a plurality of micro-operations to be performed by execution circuitry (such as execution circuitry 309). The decode circuitry 305 also decodes instruction prefixes. In some embodiments, the decode circuitry 305 translates between instruction sets and then decodes the translated instruction(s).

In some embodiments, register renaming, register allocation, and/or scheduling circuitry 307 provides functionality for one or more of: 1) renaming logical operand values to physical operand values (e.g., a register alias table in some embodiments), 2) allocating status bits and flags to the decoded instruction, and 3) scheduling the decoded instruction for execution on execution circuitry out of an instruction pool (e.g., using a reservation station in some embodiments).

Registers (register file) and/or memory 308 store data as operands of the instruction to be operated on by execution circuitry 309. Exemplary register types include packed data registers, general purpose registers, and floating-point registers.

Execution circuitry 309 executes the decoded instruction. Exemplary detailed execution circuitry is shown in FIGS. 2, 12, etc. The execution of the decoded instruction causes the execution circuitry to convert packed FP16 data elements to packed BF8 elements. Depending on the instruction, there is a single source of FP16 data elements or two sources of FP16 data elements.IS In some embodiments, retirement/write back circuitry 311 architecturally commits the destination register into the registers or memory 308 and retires the instruction.

FIG. 4 illustrates an embodiment of method performed by a processor to process a VCVTNEPH2BF8 instruction. For example, a processor core as shown in FIG. 12(B), a pipeline as detailed below, etc. performs this method.

At 401, a single VCVTNEPH2BF8 instruction is fetched. The single VCVTNEPH2BF8 includes one or more fields to identify a source operand (e.g., addressing field(s) 1505), one or more fields to identify a destination operand (e.g., addressing field(s) 1505), and one or more fields for an opcode (e.g., opcode 1503), the opcode to indicate that execution circuitry is to convert packed half-precision floating-point data from the identified source to packed bfloat8 data and store the packed bfloat8 data into corresponding data element positions of the identified destination. In some embodiments, the MOD R/M byte 1602 and/or SIB byte 1604 provide the operand locations. In some embodiments, the VCVTNEPH2BF8 includes a prefix. In some embodiments, the prefix is prefix 1501(C).

In some embodiments, the fetched instruction is translated into one or more instructions at 402. For example, the fetched instruction is translated into one or more instructions of a different instruction set architecture. Note that this translation may be performed in a hardware translation unit, or using a software translation layer.

The fetched instruction (or translated one or more instructions) is/are decoded at 403. For example, the fetched VCVTNEPH2BF8 instruction is decoded by decode circuitry such as that detailed herein.

Data values associated with the source operand of the decoded instruction are retrieved at 405. For example, when one or more of the source operands are memory operands, the data from the indicated memory location is retrieved.

At 407, the decoded single instruction is executed, or the translated one or more instructions are executed, by execution circuitry (hardware) such as that detailed herein. For the VCVTNEPH2BF8 instruction, the execution will cause execution circuitry to convert packed FP16 data from the identified source to packed BF8 data and store the packed bfloat8 data into corresponding data element positions of the identified destination. During execution, "round to nearest even" rounding mode is used. In some embodiments, the vvvv field is reserved and must be 0b111 or otherwise the instruction with throw an undefined error.

In some embodiments, the instruction is committed or retired at 409.

Figure 5:
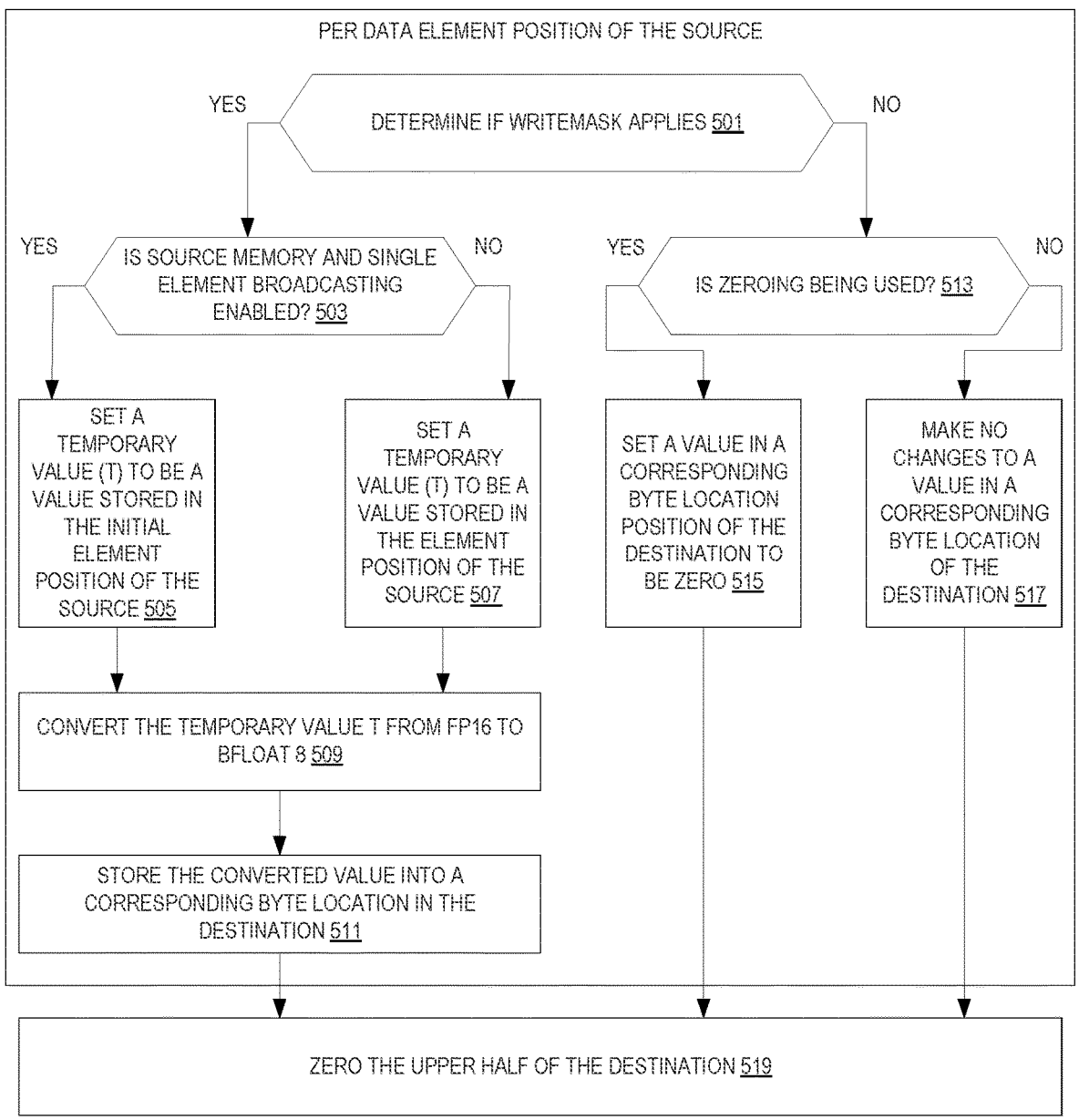
FIG. 5 illustrates embodiments of method performed by a processor to process a VCVTNEPH2BF8 instruction.

FIG. 5 illustrates embodiments of method performed by a processor to process a VCVTNEPH2BF8 instruction. In particular, the execution of the instruction is described. For example, a processor core as shown in FIG. 12(B), a pipeline as detailed below, etc. performs this method.

A plurality of actions may be applicable to each data element of the source and include one or more of 501-517. Note that the per element evaluation may be done serially or in parallel.

At 501 a determination of if a writemask applies. For example, was a writemask used? If so, was the corresponding bit position of the writemask or predicate set to allow a resulting conversion to be stored for the data element?

When the writemask applies, a determination of if the source is memory and single element broadcasting enabled is made 503 in some embodiments. In some embodiments, bit 20 of 1501(C) is used for the broadcasting setting.

When those conditions are true, a temporary value (t) is set to be a value to be stored in the initial element position of the source at 505 in some embodiments. When those conditions are not true, a temporary value (t) is set to be a value to be stored in the element position of the source at 507.

A conversion of the temporary value t from FP16 to BF8 is made at 509. FIG. 6 illustrates how this conversion is made in some embodiments in the "convert_fp16_to_bfloat8" function. The table below illustrates how t is converted according to some embodiments.

| T value | Result |
|---|---|
| Infinity | Bits[7:0] = t[15:8] |
| Not-a-number | Bits[7:0] = t[15:8] |
| | Bit[1] = 1 |
| | // truncate and set most significant bit of the |
| | //mantissa to force QNAN |
| Normal number, zero, denormal | lsb = t[8] |
| | rounding_bias = 0x007f + lsb |
| | temp[15:0] = t[15:0] + rounding bias (int add) |
| | Bits[7:0] = temp[15:8] |

The converted value is stored into a corresponding byte location in the destination at 511. For example, source[1] is stored in destination[1].

If the writemask does not apply (e.g., not set), then a determination of if is zeroing being used is made at 513. When zeroing is used, no changes are made to a value in a corresponding byte location of the destination at 517. When zeroing is not used (e.g., merge masking is used), a value in a corresponding byte location position of the destination is set to be zero at 515.

At 519 at the upper half of the destination is zeroed.

FIG. 6 illustrates embodiments of pseudocode for performing the VCVTNEPH2BF8 instruction.

FIG. 7 illustrates an embodiment of method performed by a processor to process a VCVTNE2PH2BF8 instruction. For example, a processor core as shown in FIG. 12(B), a pipeline as detailed below, etc. performs this method.

At 701, a single VCVTNE2PH2BF8 instruction is fetched. The single VCVTNE2PH2BF8 includes one or more fields to identify a two source operands (e.g., addressing field(s) 1505), one or more fields to identify a destination operand (e.g., addressing field(s) 1505), and one or more fields for an opcode (e.g., opcode 1503), the opcode to indicate that execution circuitry is to convert packed half-precision floating-point data from the identified first and second sources to packed bfloat8 data and store the packed bfloat8 data into corresponding data element positions of the identified destination. In some embodiments, the MOD R/M byte 1602, vvvv of prefix BPF01(C)m and/or SIB byte 1604 provide the operand locations.

In some embodiments, the fetched instruction is translated into one or more instructions at 702. For example, the fetched instruction is translated into one or more instructions of a different instruction set architecture. Note that this translation may be performed in a hardware translation unit, or using a software translation layer.

The fetched instruction (or translated one or more instructions) is/are decoded at 703. For example, the fetched VCVTNE2PH2BF8 instruction is decoded by decode circuitry such as that detailed herein.

Data values associated with the source operands of the decoded instruction are retrieved at 705. For example, when one or more of the source operands are memory operands, the data from the indicated memory location is retrieved.

At 707, the decoded single instruction is executed, or the translated one or more instructions are executed, by execution circuitry (hardware) such as that detailed herein. For the VCVTNE2PH2BF8 instruction, the execution will cause execution circuitry to convert packed half-precision floating-point data from the identified first and second sources to packed bfloat8 data and store the packed bfloat8 data into corresponding data element positions of the identified destination. During execution, "round to nearest even" rounding mode is used In some embodiments, the instruction is committed or retired at 709.

Figure 8A:
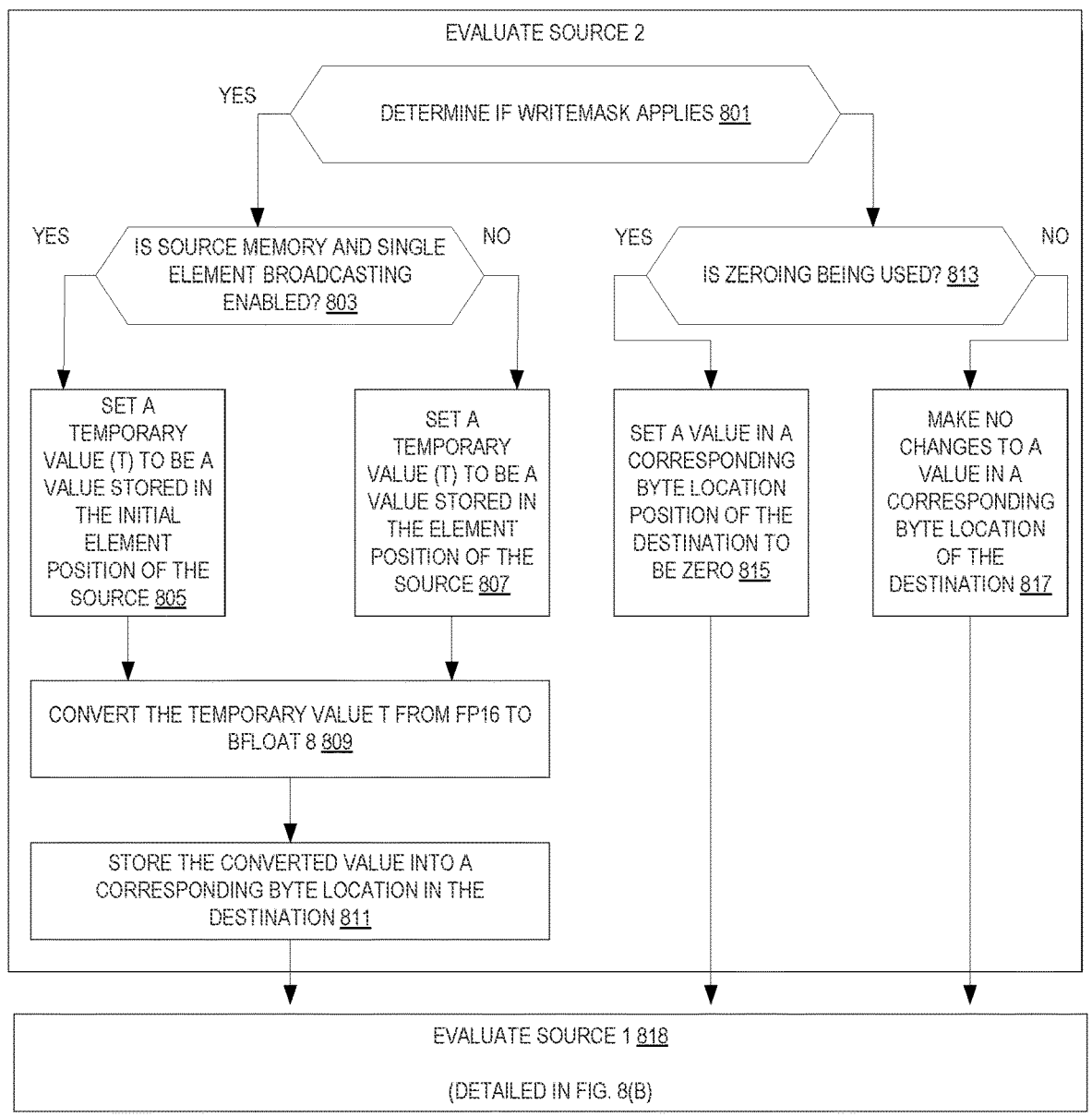
FIGS. 8(A)-(B) illustrates embodiments of method performed by a processor to process a VCVTNE2PH2BF8 instruction.
Figure 8B:
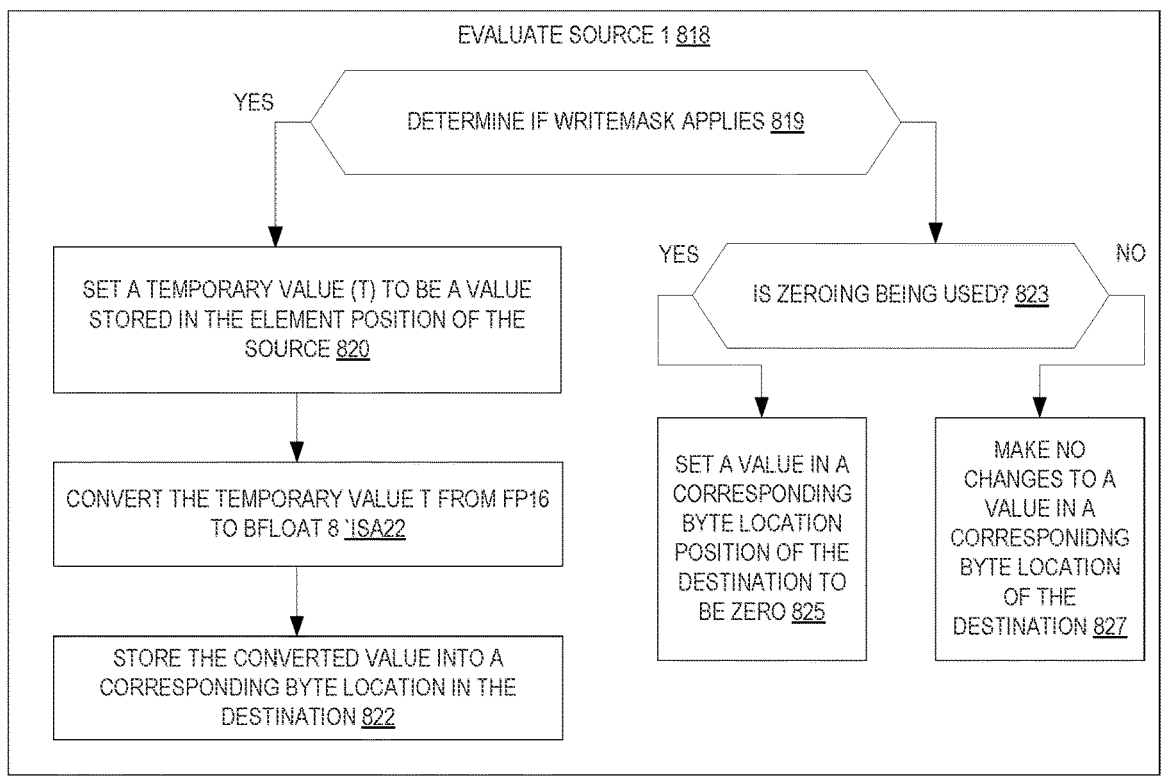

FIGS. 8(A)-(B) illustrates embodiments of method performed by a processor to process a VCVTNE2PH2BF8 instruction. In particular, the execution of the instruction is described. For example, a processor core as shown in FIG. 12(B), a pipeline as detailed below, etc. performs this method. Recall that the first and second sources as essentially treated as a single source (e.g., a concatenation of the two sources) for the purposes of data element positions of the destination A plurality of actions may be applicable to each data element of the second source and include one or more of 801-ISAG17. Note that the per element evaluation may be done serially or in parallel.

At 801 a determination of if a writemask applies. For example, was a writemask used? If so, was the corresponding bit position of the writemask or predicate set to allow a resulting conversion to be stored for the data element?

When the writemask applies, a determination of if the second source is memory and single element broadcasting enabled is made 803 in some embodiments. In some embodiments, bit 20 of 1501(C) is used for the broadcasting setting.

When those conditions are true, a temporary value (t) is set to be a value to be stored in the initial element position of the source at 805 in some embodiments. When those conditions are not true, a temporary value (t) is set to be a value to be stored in the element position of the source at 807.

A conversion of the temporary value t from FP16 to BF8 is made at 809. FIG. 6 illustrates how this conversion is made in some embodiments in the "convert_fp16_to_bfloat8" function. The table below illustrates how t is converted according to some embodiments.

| T value | Result |
| --- | --- |
| Infinity | Bits[7:0] = t[15:8] |
| Not-a-number | Bits[7:0] = t[15:8] |
| | Bit[1] = 1 |
| | // truncate and set most significant bit of the |
| | //mantissa to force QNAN |
| Normal number, zero, denormal | lsb = t[8] |
| | rounding_bias = 0x007f + lsb |
| | temp[15:0] = t[15:0] + rounding bias (int add) |
| | Bits[7:0] = temp[15:8] |

The converted value is stored into a corresponding byte location in the destination at 811. For example, source[1] is stored in destination[1].

If the writemask does not apply (e.g., not set), then a determination of if is zeroing being used is made at 813. When zeroing is used, no changes are made to a value in a corresponding byte location of the destination at 817. When zeroing is not used (e.g., merge masking is used), a value in a corresponding byte location position of the destination is set to be zero at 815.

The first source is evaluated at 818 and this evaluation may include several actions. At 819 a determination of if a writemask applies. For example, was a writemask used? If so, was the corresponding bit position of the writemask or predicate set to allow a resulting conversion to be stored for the data element?

When the writemask applies, a temporary value (t) is set to be a value to be stored in the initial element position of the source at 820. A conversion of the temporary value t from FP16 to BF8 is made at 822. FIG. 9 illustrates how this conversion is made in some embodiments in the "convert_fp16_to_bfloat8" function.

The table below illustrates how t is converted according to some embodiments.

| T value | Result |
| --- | --- |
| Infinity | Bits[7:0] = t[15:8] |
| Not-a-number | Bits[7:0] = t[15:8] |
| | Bit[1] = 1 |
| | // truncate and set most significant bit of the |
| | //mantissa to force QNAN |
| Normal number, zero, denormal | lsb = t[8] |
| | rounding_bias = 0x007f + lsb |
| | temp[15:0] = t[15:0] + rounding bias (int add) |
| | Bits[7:0] = temp[15:8] |

The converted value is stored into a corresponding byte location in the destination at 822. Note that this corresponding location needs to account for the storage from the second source. For example, source1[0] is stored in destination[N].

If the writemask does not apply (e.g., not set), then a determination of if is zeroing being used is made at 823. When zeroing is used, no changes are made to a value in a corresponding byte location of the destination at 825. When zeroing is not used (e.g., merge masking is used), a value in a corresponding byte location position of the destination is set to be zero at 827.

FIG. 9 illustrates embodiments of pseudocode for performing the VCVTNE2PH2BF8 instruction.

The instructions detailed above may be used in a variety of computer architectures and environments, utilize one or more instruction formats, etc. Embodiments of exemplary architectures, formats, etc. are detailed below.

Exemplary Computer Architectures

Detailed below are describes of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
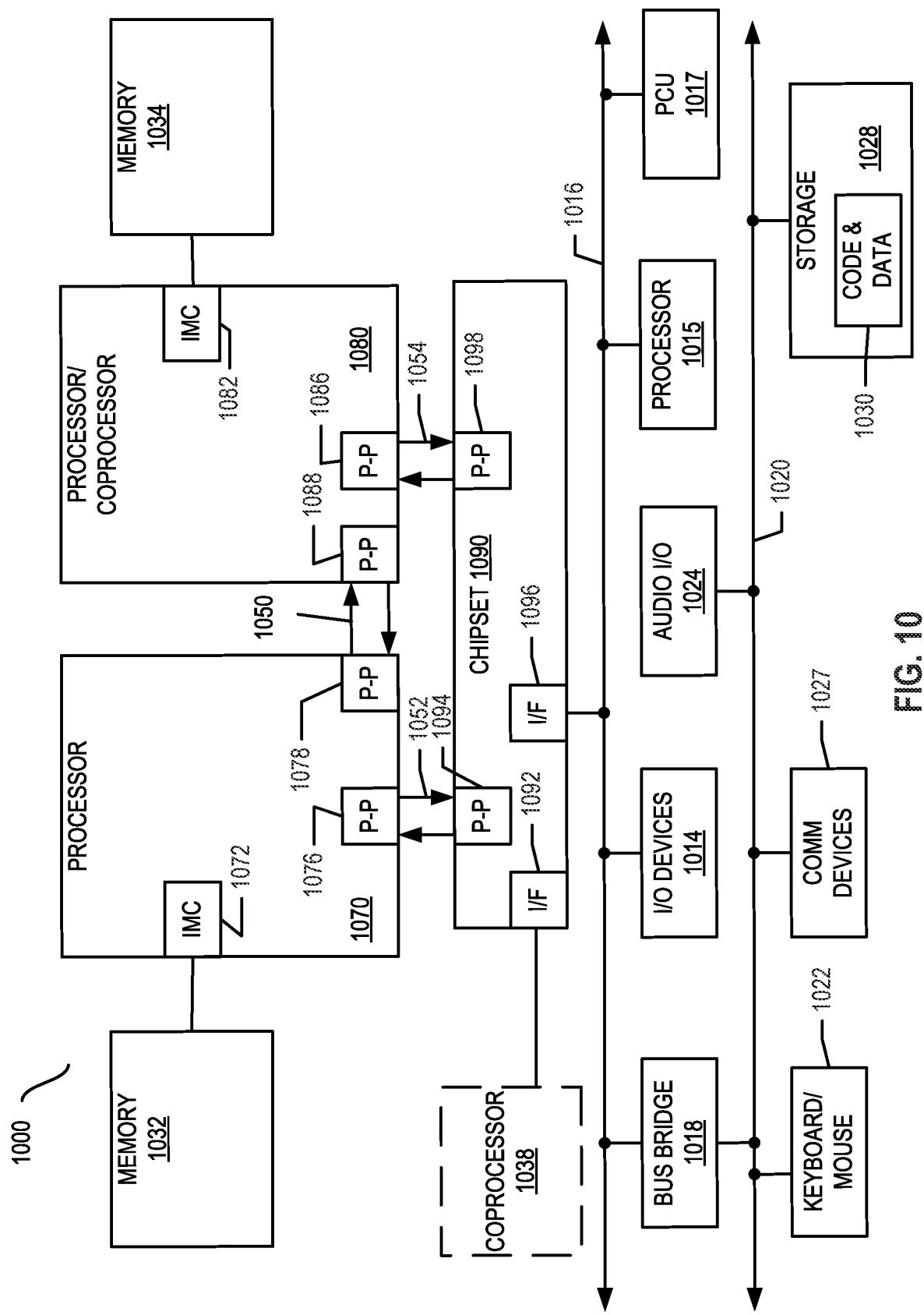
FIG. 10 illustrates embodiments of an exemplary system.

FIG. 10 illustrates embodiments of an exemplary system. Multiprocessor system 1000 is a point-to-point interconnect system and includes a plurality of processors including a first processor 1070 and a second processor 1080 coupled via a point-to-point interconnect 1050. In some embodiments, the first processor 1070 and the second processor 1080 are homogeneous. In some embodiments, first processor 1070 and the second processor 1080 are heterogenous.

Processors 1070 and 1080 are shown including integrated memory controller (IMC) units circuitry 1072 and 1082, respectively. Processor 1070 also includes as part of its interconnect controller units point-to-point (P-P) interfaces 1076 and 1078; similarly, second processor 1080 includes P-P interfaces 1086 and 1088. Processors 1070, 1080 may exchange information via the point-to-point (P-P) interconnect 1050 using P-P interface circuits 1078, 1088. IMCs 1072 and 1082 couple the processors 1070, 1080 to respective memories, namely a memory 1032 and a memory 1034, which may be portions of main memory locally attached to the respective processors.

Processors 1070, 1080 may each exchange information with a chipset 1090 via individual P-P interconnects 1052, 1054 using point to point interface circuits 1076, 1094, 1086, 1098. Chipset 1090 may optionally exchange information with a coprocessor 1038 via a high-performance interface 1092. In some embodiments, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor 1070, 1080 or outside of both processors, yet connected with the processors via P-P interconnect, such that either or both processors' local cache information may be stored in the shared cache if a processor is placed into a low power mode.

Chipset 1090 may be coupled to a first interconnect 1016 via an interface 1096. In some embodiments, first interconnect 1016 may be a Peripheral Component Interconnect (PCI) interconnect, or an interconnect such as a PCI Express interconnect or another I/O interconnect. In some embodiments, one of the interconnects couples to a power control unit (PCU) 1017, which may include circuitry, software, and/or firmware to perform power management operations with regard to the processors 1070, 1080 and/or co-processor 1038. PCU 1017 provides control information to a voltage regulator to cause the voltage regulator to generate the appropriate regulated voltage. PCU 1017 also provides control information to control the operating voltage generated. In various embodiments, PCU 1017 may include a variety of power management logic units (circuitry) to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software).

PCU 1017 is illustrated as being present as logic separate from the processor 1070 and/or processor 1080. In other cases, PCU 1017 may execute on a given one or more of cores (not shown) of processor 1070 or 1080. In some cases, PCU 1017 may be implemented as a microcontroller (dedicated or general-purpose) or other control logic configured to execute its own dedicated power management code, sometimes referred to as P-code. In yet other embodiments, power management operations to be performed by PCU 1017 may be implemented externally to a processor, such as by way of a separate power management integrated circuit (PMIC) or another component external to the processor. In yet other embodiments, power management operations to be performed by PCU 1017 may be implemented within BIOS or other system software.

Various I/O devices 1014 may be coupled to first interconnect 1016, along with an interconnect (bus) bridge 1018 which couples first interconnect 1016 to a second interconnect 1020. In some embodiments, one or more additional processor(s) 1015, such as coprocessors, high-throughput MIC processors, GPGPU's, accelerators (such as, e.g., graphics accelerators or digital signal processing (DSP) units), field programmable gate arrays (FPGAs), or any other processor, are coupled to first interconnect 1016. In some embodiments, second interconnect 1020 may be a low pin count (LPC) interconnect. Various devices may be coupled to second interconnect 1020 including, for example, a keyboard and/or mouse 1022, communication devices 1027 and a storage unit circuitry 1028. Storage unit circuitry 1028 may be a disk drive or other mass storage device which may include instructions/code and data 1030, in some embodiments. In some embodiments, the instructions/code and data 1030 include a binary translator or other emulation functionality. Further, an audio I/O 1024 may be coupled to second interconnect 1020. Note that other architectures than the point-to-point architecture described above are possible. For example, instead of the point-to-point architecture, a system such as multiprocessor system 1000 may implement a multi-drop interconnect or other such architecture.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die as the described CPU (sometimes referred to as the application core(s) or application processor(s)), the above described coprocessor, and additional functionality. Exemplary core architectures are described next, followed by descriptions of exemplary processors and computer architectures.

Figure 11:
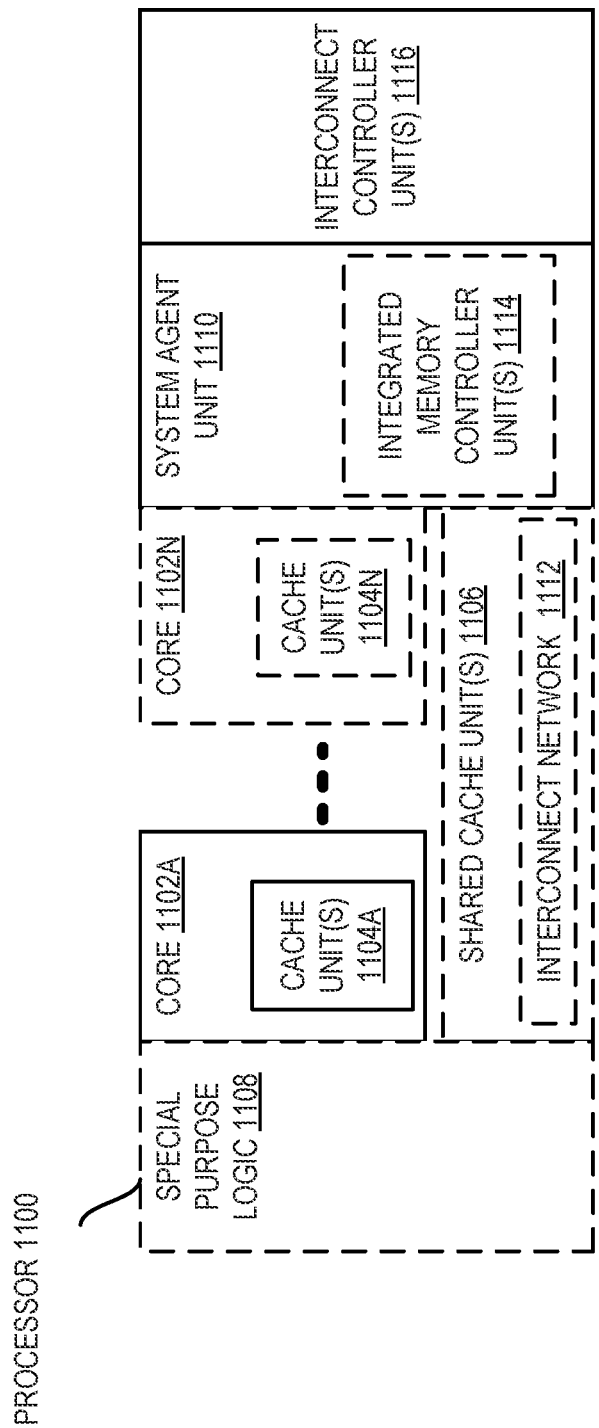
FIG. 11 illustrates a block diagram of embodiments of a processor.

FIG. 11 illustrates a block diagram of embodiments of a processor 1100 that may have more than one core, may have an integrated memory controller, and may have integrated graphics. The solid lined boxes illustrate a processor 1100 with a single core 1102A, a system agent 1110, a set of one or more interconnect controller units circuitry 1116, while the optional addition of the dashed lined boxes illustrates an alternative processor 1100 with multiple cores 1102(A)-(N), a set of one or more integrated memory controller unit(s) circuitry 1114 in the system agent unit circuitry 1110, and special purpose logic 1108, as well as a set of one or more interconnect controller units circuitry 1116. Note that the processor 1100 may be one of the processors 1070 or 1080, or co-processor 1038 or 1015 of FIG. 10.

Thus, different implementations of the processor 1100 may include: 1) a CPU with the special purpose logic 1108 being integrated graphics and/or scientific (throughput) logic (which may include one or more cores, not shown), and the cores 1102(A)-(N) being one or more general purpose cores (e.g., general purpose in-order cores, general purpose out-of-order cores, or a combination of the two); 2) a coprocessor with the cores 1102(A)-(N) being a large number of special purpose cores intended primarily for graphics and/or scientific (throughput); and 3) a coprocessor with the cores 1102(A)-(N) being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit circuitry), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, BiCMOS, CMOS, or NMOS.

A memory hierarchy includes one or more levels of cache unit(s) circuitry 1104(A)-(N) within the cores 1102(A)-(N), a set of one or more shared cache units circuitry 1106, and external memory (not shown) coupled to the set of integrated memory controller units circuitry 1114. The set of one or more shared cache units circuitry 1106 may include one or more mid-level caches, such as level 2 (L2), level 3 (L3), level 4 (L4), or other levels of cache, such as a last level cache (LLC), and/or combinations thereof. While in some embodiments ring-based interconnect network circuitry 1112 interconnects the special purpose logic 1108 (e.g., integrated graphics logic), the set of shared cache units circuitry 1106, and the system agent unit circuitry 1110, alternative embodiments use any number of well-known techniques for interconnecting such units. In some embodiments, coherency is maintained between one or more of the shared cache units circuitry 1106 and cores 1102(A)-(N).

In some embodiments, one or more of the cores 1102(A)-(N) are capable of multi-threading. The system agent unit circuitry 1110 includes those components coordinating and operating cores 1102(A)-(N). The system agent unit circuitry 1110 may include, for example, power control unit (PCU) circuitry and/or display unit circuitry (not shown). The PCU may be or may include logic and components needed for regulating the power state of the cores 1102(A)-(N) and/or the special purpose logic 1108 (e.g., integrated graphics logic). The display unit circuitry is for driving one or more externally connected displays.

The cores 1102(A)-(N) may be homogenous or heterogeneous in terms of architecture instruction set; that is, two or more of the cores 1102(A)-(N) may be capable of executing the same instruction set, while other cores may be capable of executing only a subset of that instruction set or a different instruction set.

Exemplary Core Architectures
In-Order and Out-of-Order Core Block Diagram

Figure 12A:
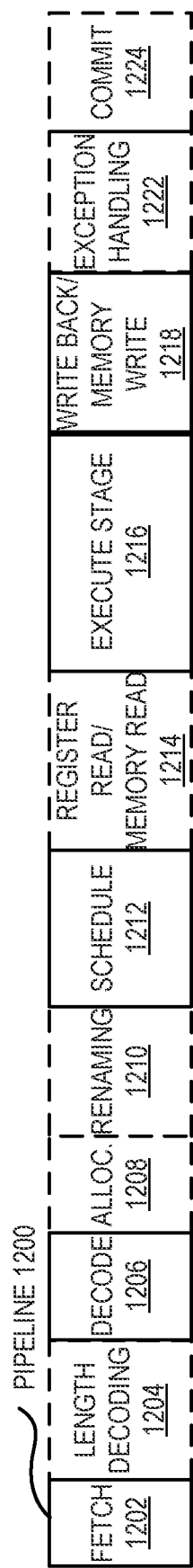
FIG. 12(A) is a block diagram illustrating both an exemplary in-order pipeline and an exemplary register renaming, out-of-order issue/execution pipeline according to embodiments of the invention.
Figure 12B:
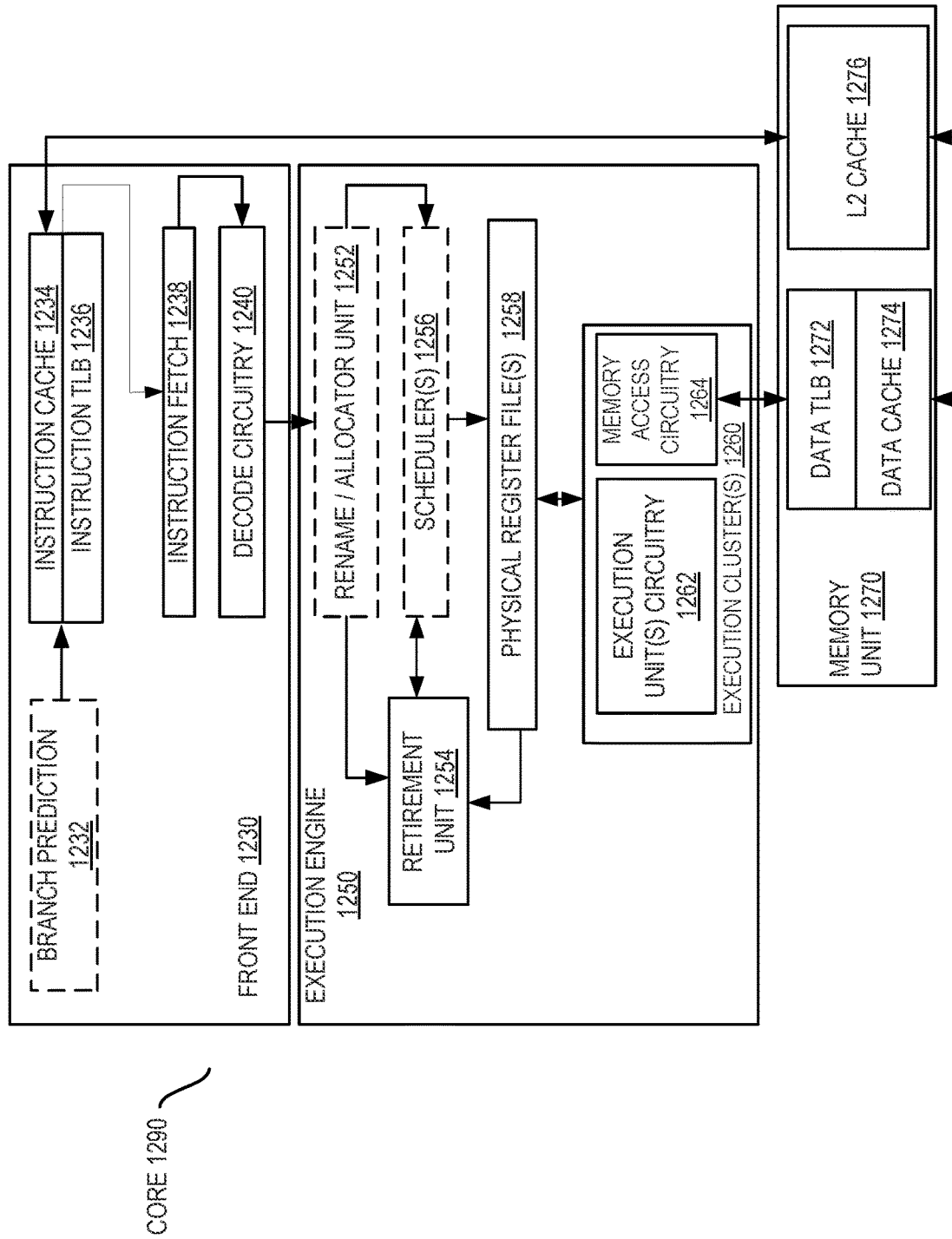
FIG. 12(B) is a block diagram illustrating both an exemplary embodiment of an in-order architecture core and an exemplary register renaming, out-of-order issue/execution architecture core to be included in a processor according to embodiments of the invention.

FIG. 12(A) is a block diagram illustrating both an exemplary in-order pipeline and an exemplary register renaming, out-of-order issue/execution pipeline according to embodiments of the invention. FIG. 12(B) is a block diagram illustrating both an exemplary embodiment of an in-order architecture core and an exemplary register renaming, out-of-order issue/execution architecture core to be included in a processor according to embodiments of the invention. The solid lined boxes in FIGS. 12(A)-(B) illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 12(A), a processor pipeline 1200 includes a fetch stage 1202, an optional length decode stage 1204, a decode stage 1206, an optional allocation stage 1208, an optional renaming stage 1210, a scheduling (also known as a dispatch or issue) stage 1212, an optional register read/memory read stage 1214, an execute stage 1216, a write back/memory write stage 1218, an optional exception handling stage 1222, and an optional commit stage 1224. One or more operations can be performed in each of these processor pipeline stages. For example, during the fetch stage 1202, one or more instructions are fetched from instruction memory, during the decode stage 1206, the one or more fetched instructions may be decoded, addresses (e.g., load store unit (LSU) addresses) using forwarded register ports may be generated, and branch forwarding (e.g., immediate offset or an link register (LR)) may be performed. In one embodiment, the decode stage 1206 and the register read/memory read stage 1214 may be combined into one pipeline stage. In one embodiment, during the execute stage 1216, the decoded instructions may be executed, LSU address/data pipelining to an Advanced Microcontroller Bus (AHB) interface may be performed, multiply and add operations may be performed, arithmetic operations with branch results may be performed, etc.

By way of example, the exemplary register renaming, out-of-order issue/execution core architecture may implement the pipeline 1200 as follows: 1) the instruction fetch 1238 performs the fetch and length decoding stages 1202 and 1204; 2) the decode unit circuitry 1240 performs the decode stage 1206; 3) the rename/allocator unit circuitry 1252 performs the allocation stage 1208 and renaming stage 1210; 4) the scheduler unit(s) circuitry 1256 performs the schedule stage 1212; 5) the physical register file(s) unit(s) circuitry 1258 and the memory unit circuitry 1270 perform the register read/memory read stage 1214; the execution cluster 1260 perform the execute stage 1216; 6) the memory unit circuitry 1270 and the physical register file(s) unit(s) circuitry 1258 perform the write back/memory write stage 1218; 7) various units (unit circuitry) may be involved in the exception handling stage 1222; and 8) the retirement unit circuitry 1254 and the physical register file(s) unit(s) circuitry 1258 perform the commit stage 1224.

FIG. 12(B) shows processor core 1290 including front-end unit circuitry 1230 coupled to an execution engine unit circuitry 1250, and both are coupled to a memory unit circuitry 1270. The core 1290 may be a reduced instruction set computing (RISC) core, a complex instruction set computing (CISC) core, a very long instruction word (VLIW) core, or a hybrid or alternative core type. As yet another option, the core 1290 may be a special-purpose core, such as, for example, a network or communication core, compression engine, coprocessor core, general purpose computing graphics processing unit (GPGPU) core, graphics core, or the like.

The front end unit circuitry 1230 may include branch prediction unit circuitry 1232 coupled to an instruction cache unit circuitry 1234, which is coupled to an instruction translation lookaside buffer (TLB) 1236, which is coupled to instruction fetch unit circuitry 1238, which is coupled to decode unit circuitry 1240. In one embodiment, the instruction cache unit circuitry 1234 is included in the memory unit circuitry 1270 rather than the front-end unit circuitry 1230. The decode unit circuitry 1240 (or decoder) may decode instructions, and generate as an output one or more micro-operations, micro-code entry points, microinstructions, other instructions, or other control signals, which are decoded from, or which otherwise reflect, or are derived from, the original instructions. The decode unit circuitry 1240 may further include an address generation unit circuitry (AGU, not shown). In one embodiment, the AGU generates an LSU address using forwarded register ports, and may further perform branch forwarding (e.g., immediate offset branch forwarding, LR register branch forwarding, etc.). The decode unit circuitry 1240 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1290 includes a microcode ROM (not shown) or other medium that stores microcode for certain macroinstructions (e.g., in decode unit circuitry 1240 or otherwise within the front end unit circuitry 1230). In one embodiment, the decode unit circuitry 1240 includes a micro-operation (micro-op) or operation cache (not shown) to hold/cache decoded operations, micro-tags, or micro-operations generated during the decode or other stages of the processor pipeline 1200. The decode unit circuitry 1240 may be coupled to rename/allocator unit circuitry 1252 in the execution engine unit circuitry 1250.

The execution engine circuitry 1250 includes the rename/allocator unit circuitry 1252 coupled to a retirement unit circuitry 1254 and a set of one or more scheduler(s) circuitry 1256. The scheduler(s) circuitry 1256 represents any number of different schedulers, including reservations stations, central instruction window, etc. In some embodiments, the scheduler(s) circuitry 1256 can include arithmetic logic unit (ALU) scheduler/scheduling circuitry, ALU queues, arithmetic generation unit (AGU) scheduler/scheduling circuitry, AGU queues, etc. The scheduler(s) circuitry 1256 is coupled to the physical register file(s) circuitry 1258. Each of the physical register file(s) circuitry 1258 represents one or more physical register files, different ones of which store one or more different data types, such as scalar integer, scalar floating-point, packed integer, packed floating-point, vector integer, vector floating-point, status (e.g., an instruction pointer that is the address of the next instruction to be executed), etc. In one embodiment, the physical register file(s) unit circuitry 1258 includes vector registers unit circuitry, writemask registers unit circuitry, and scalar register unit circuitry. These register units may provide architectural vector registers, vector mask registers, general-purpose registers, etc. The physical register file(s) unit(s) circuitry 1258 is overlapped by the retirement unit circuitry 1254 (also known as a retire queue or a retirement queue) to illustrate various ways in which register renaming and out-of-order execution may be implemented (e.g., using a reorder buffer(s) (ROB(s)) and a retirement register file(s); using a future file(s), a history buffer(s), and a retirement register file(s); using a register maps and a pool of registers; etc.). The retirement unit circuitry 1254 and the physical register file(s) circuitry 1258 are coupled to the execution cluster(s) 1260. The execution cluster(s) 1260 includes a set of one or more execution units circuitry 1262 and a set of one or more memory access circuitry 1264. The execution units circuitry 1262 may perform various arithmetic, logic, floating-point or other types of operations (e.g., shifts, addition, subtraction, multiplication) and on various types of data (e.g., scalar floating-point, packed integer, packed floating-point, vector integer, vector floating-point). While some embodiments may include a number of execution units or execution unit circuitry dedicated to specific functions or sets of functions, other embodiments may include only one execution unit circuitry or multiple execution units/execution unit circuitry that all perform all functions. The scheduler(s) circuitry 1256, physical register file(s) unit(s) circuitry 1258, and execution cluster(s) 1260 are shown as being possibly plural because certain embodiments create separate pipelines for certain types of data/operations (e.g., a scalar integer pipeline, a scalar floating-point/packed integer/packed floating-point/vector integer/vector floating-point pipeline, and/or a memory access pipeline that each have their own scheduler circuitry, physical register file(s) unit circuitry, and/or execution cluster—and in the case of a separate memory access pipeline, certain embodiments are implemented in which only the execution cluster of this pipeline has the memory access unit(s) circuitry 1264). It should also be understood that where separate pipelines are used, one or more of these pipelines may be out-of-order issue/execution and the rest in-order.

In some embodiments, the execution engine unit circuitry 1250 may perform load store unit (LSU) address/data pipelining to an Advanced Microcontroller Bus (AHB) interface (not shown), and address phase and writeback, data phase load, store, and branches.

The set of memory access circuitry 1264 is coupled to the memory unit circuitry 1270, which includes data TLB unit circuitry 1272 coupled to a data cache circuitry 1274 coupled to a level 2 (L2) cache circuitry 1276. In one exemplary embodiment, the memory access units circuitry 1264 may include a load unit circuitry, a store address unit circuit, and a store data unit circuitry, each of which is coupled to the data TLB circuitry 1272 in the memory unit circuitry 1270. The instruction cache circuitry 1234 is further coupled to a level 2 (L2) cache unit circuitry 1276 in the memory unit circuitry 1270. In one embodiment, the instruction cache 1234 and the data cache 1274 are combined into a single instruction and data cache (not shown) in L2 cache unit circuitry 1276, a level 3 (L3) cache unit circuitry (not shown), and/or main memory. The L2 cache unit circuitry 1276 is coupled to one or more other levels of cache and eventually to a main memory.

The core 1290 may support one or more instructions sets (e.g., the x86 instruction set (with some extensions that have been added with newer versions); the MIPS instruction set; the ARM instruction set (with optional additional extensions such as NEON)), including the instruction(s) described herein. In one embodiment, the core 1290 includes logic to support a packed data instruction set extension (e.g., AVX1, AVX2), thereby allowing the operations used by many multimedia applications to be performed using packed data.

Exemplary Execution Unit(s) Circuitry

Figure 13:
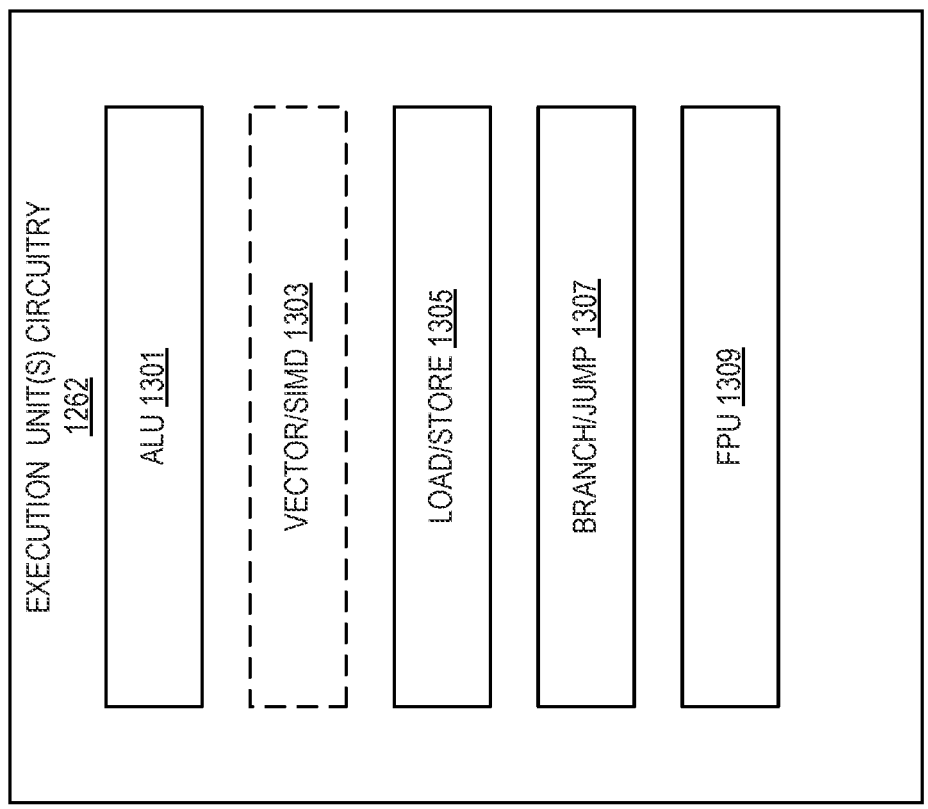
FIG. 13 illustrates embodiments of execution unit(s) circuitry.

FIG. 13 illustrates embodiments of execution unit(s) circuitry, such as execution unit(s) circuitry 1262 of FIG. 12(B). As illustrated, execution unit(s) circuitry 1262 may include one or more ALU circuits 1301, vector/SIMD unit circuits 1303, load/store unit circuits 1305, and/or branch/jump unit circuits 1307. ALU circuits 1301 perform integer arithmetic and/or Boolean operations. Vector/SIMD unit circuits 1303 perform vector/SIMD operations on packed data (such as SIMD/vector registers). Load/store unit circuits 1305 execute load and store instructions to load data from memory into registers or store from registers to memory. Load/store unit circuits 1305 may also generate addresses. Branch/jump unit circuits 1307 cause a branch or jump to a memory address depending on the instruction. Floating-point unit (FPU) circuits 1309 perform floating-point arithmetic. The width of the execution unit(s) circuitry 1262 varies depending upon the embodiment and can range from 16-bit to 1,024-bit. In some embodiments, two or more smaller execution units are logically combined to form a larger execution unit (e.g., two 128-bit execution units are logically combined to form a 256-bit execution unit).

Exemplary Register Architecture

Figure 14:
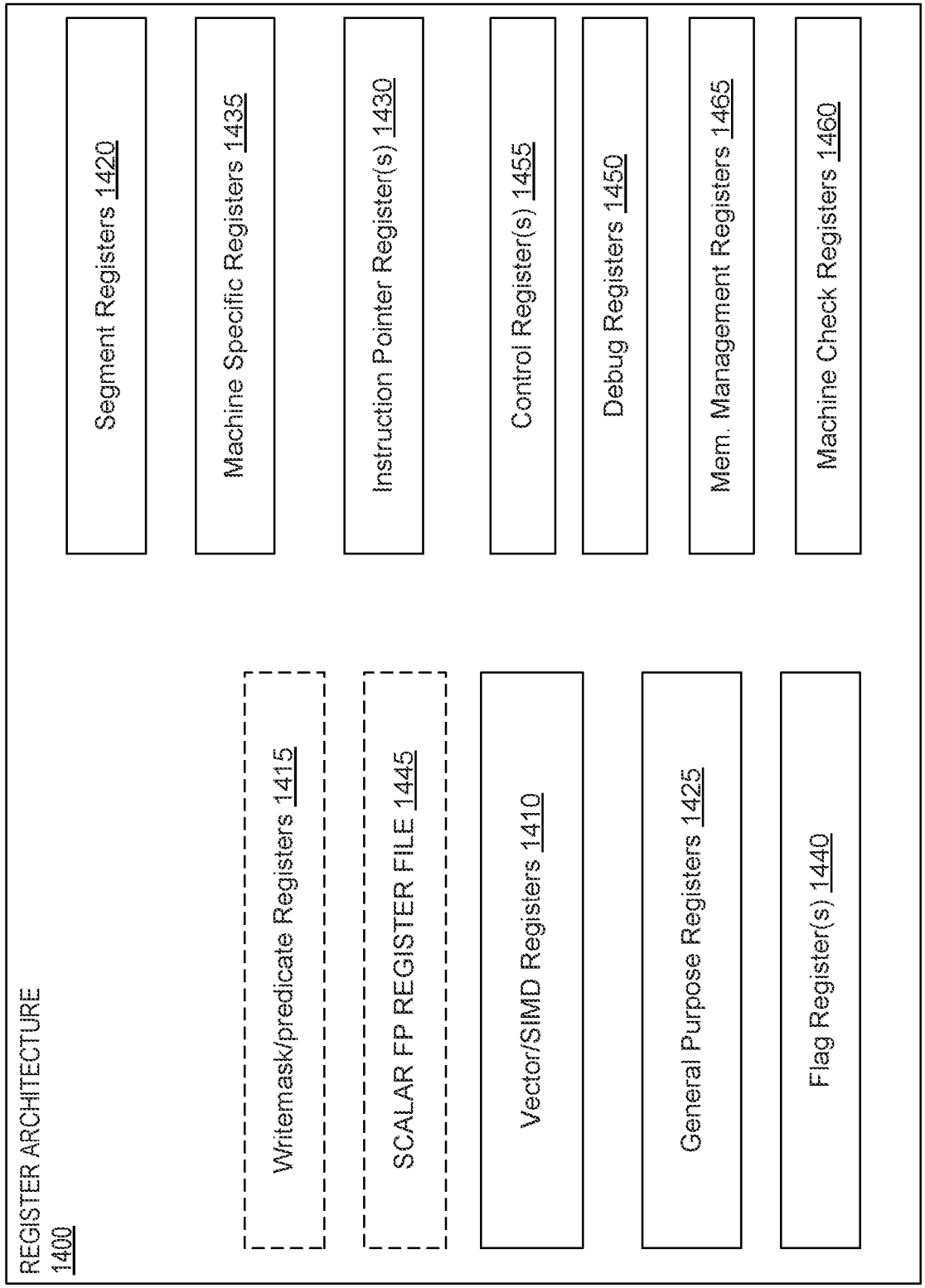
FIG. 14 is a block diagram of a register architecture according to some embodiments.

FIG. 14 is a block diagram of a register architecture 1400 according to some embodiments. As illustrated, there are vector/SIMD registers 1410 that vary from 128-bit to 1,024 bits width. In some embodiments, the vector/SIMD registers 1410 are physically 512-bits and, depending upon the mapping, only some of the lower bits are used. For example, in some embodiments, the vector/SIMD registers 1410 are ZMM registers which are 512 bits: the lower 256 bits are used for YMM registers and the lower 128 bits are used for XMM registers. As such, there is an overlay of registers. In some embodiments, a vector length field selects between a maximum length and one or more other shorter lengths, where each such shorter length is half the length of the preceding length. Scalar operations are operations performed on the lowest order data element position in a ZMM/YMM/XMM register; the higher order data element positions are either left the same as they were prior to the instruction or zeroed depending on the embodiment.

In some embodiments, the register architecture 1400 includes writemask/predicate registers 1415. For example, in some embodiments, there are 8 writemask/predicate registers (sometimes called k0 through k7) that are each 16-bit, 32-bit, 64-bit, or 128-bit in size. Writemask/predicate registers 1415 may allow for merging (e.g., allowing any set of elements in the destination to be protected from updates during the execution of any operation) and/or zeroing (e.g., zeroing vector masks allow any set of elements in the destination to be zeroed during the execution of any operation). In some embodiments, each data element position in a given writemask/predicate register 1415 corresponds to a data element position of the destination. In other embodiments, the writemask/predicate registers 1415 are scalable and consists of a set number of enable bits for a given vector element (e.g., 8 enable bits per 64-bit vector element).

The register architecture 1400 includes a plurality of general-purpose registers 1425. These registers may be 16-bit, 32-bit, 64-bit, etc. and can be used for scalar operations. In some embodiments, these registers are referenced by the names RAX, RBX, RCX, RDX, RBP, RSI, RDI, RSP, and R8 through R15.

In some embodiments, the register architecture 1400 includes scalar floating-point register 1445 which is used for scalar floating-point operations on 32/64/80-bit floating-point data using the x87 instruction set extension or as MMX registers to perform operations on 64-bit packed integer data, as well as to hold operands for some operations performed between the MMX and XMM registers.

One or more flag registers 1440 (e.g., EFLAGS, RFLAGS, etc.) store status and control information for arithmetic, compare, and system operations. For example, the one or more flag registers 1440 may store condition code information such as carry, parity, auxiliary carry, zero, sign, and overflow. In some embodiments, the one or more flag registers 1440 are called program status and control registers.

Segment registers 1420 contain segment points for use in accessing memory. In some embodiments, these registers are referenced by the names CS, DS, SS, ES, FS, and GS.

Machine specific registers (MSRs) 1435 control and report on processor performance. Most MSRs 1435 handle system-related functions and are not accessible to an application program. Machine check registers 1460 consist of control, status, and error reporting MSRs that are used to detect and report on hardware errors.

One or more instruction pointer register(s) 1430 store an instruction pointer value. Control register(s) 1455 (e.g., CR0-CR4) determine the operating mode of a processor (e.g., processor 1070, 1080, 1038, 1015, and/or 1100) and the characteristics of a currently executing task. Debug registers 1450 control and allow for the monitoring of a processor or core's debugging operations.

Memory management registers 1465 specify the locations of data structures used in protected mode memory management. These registers may include a GDTR, IDRT, task register, and a LDTR register.

Alternative embodiments of the invention may use wider or narrower registers. Additionally, alternative embodiments of the invention may use more, less, or different register files and registers.

Instruction Sets

An instruction set architecture (ISA) may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or sub-formats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands.

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Figure 15:
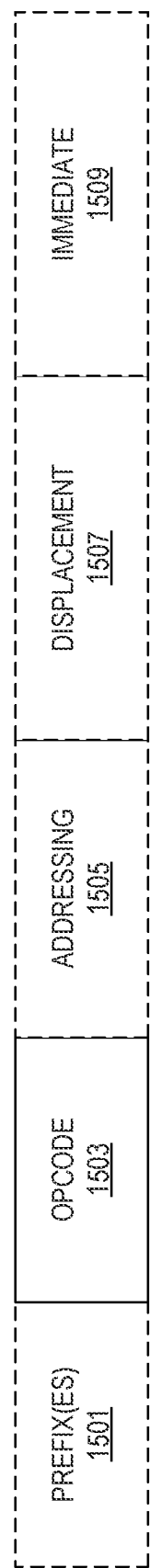
FIG. 15 illustrates embodiments of an instruction format.

FIG. 15 illustrates embodiments of an instruction format. As illustrated, an instruction may include multiple components including, but not limited to, one or more fields for: one or more prefixes 1501, an opcode 1503, addressing information 1505 (e.g., register identifiers, memory addressing information, etc.), a displacement value 1507, and/or an immediate 1509. Note that some instructions utilize some or all of the fields of the format whereas others may only use the field for the opcode 1503. In some embodiments, the order illustrated is the order in which these fields are to be encoded, however, it should be appreciated that in other embodiments these fields may be encoded in a different order, combined, etc.

The prefix(es) field(s) 1501, when used, modifies an instruction. In some embodiments, one or more prefixes are used to repeat string instructions (e.g., 0xF0, 0xF2, 0xF3, etc.), to provide section overrides (e.g., 0x2E, 0x36, 0x3E, 0x26, 0x64, 0x65, 0x2E, 0x3E, etc.), to perform bus lock operations, and/or to change operand (e.g., 0x66) and address sizes (e.g., 0x67). Certain instructions require a mandatory prefix (e.g., 0x66, 0xF2, 0xF3, etc.). Certain of these prefixes may be considered "legacy" prefixes. Other prefixes, one or more examples of which are detailed herein, indicate, and/or provide further capability, such as specifying particular registers, etc. The other prefixes typically follow the "legacy" prefixes.

The opcode field 1503 is used to at least partially define the operation to be performed upon a decoding of the instruction. In some embodiments, a primary opcode encoded in the opcode field 1503 is 1, 2, or 3 bytes in length. In other embodiments, a primary opcode can be a different length. An additional 3-bit opcode field is sometimes encoded in another field.

Figure 16:
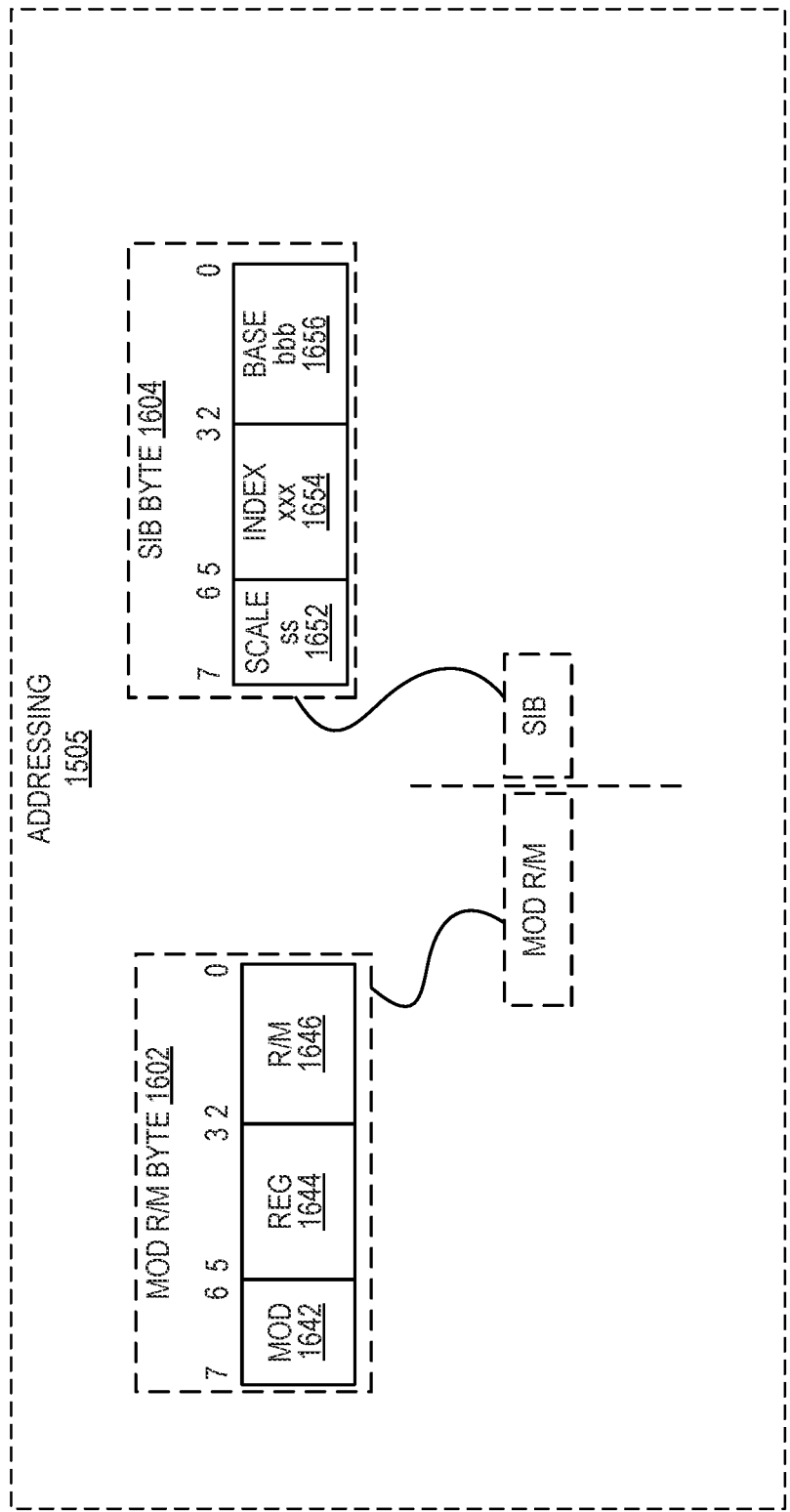
FIG. 16 illustrates embodiments of the addressing field.

The addressing field 1505 is used to address one or more operands of the instruction, such as a location in memory or one or more registers. FIG. 16 illustrates embodiments of the addressing field 1505. In this illustration, an optional ModR/M byte 1602 and an optional Scale, Index, Base (SIB) byte 1604 are shown. The ModR/M byte 1602 and the SIB byte 1604 are used to encode up to two operands of an instruction, each of which is a direct register or effective memory address. Note that each of these fields are optional in that not all instructions include one or more of these fields. The MOD R/M byte 1602 includes a MOD field 1642, a register field 1644, and R/M field 1646.

The content of the MOD field 1642 distinguishes between memory access and non-memory access modes. In some embodiments, when the MOD field 1642 has a value of b11, a register-direct addressing mode is utilized, and otherwise register-indirect addressing is used.

The register field 1644 may encode either the destination register operand or a source register operand, or may encode an opcode extension and not be used to encode any instruction operand. The content of register index field 1644, directly or through address generation, specifies the locations of a source or destination operand (either in a register or in memory). In some embodiments, the register field 1644 is supplemented with an additional bit from a prefix (e.g., prefix 1501) to allow for greater addressing.

The R/M field 1646 may be used to encode an instruction operand that references a memory address, or may be used to encode either the destination register operand or a source register operand. Note the R/M field 1646 may be combined with the MOD field 1642 to dictate an addressing mode in some embodiments.

The SIB byte 1604 includes a scale field 1652, an index field 1654, and a base field 1656 to be used in the generation of an address. The scale field 1652 indicates scaling factor. The index field 1654 specifies an index register to use. In some embodiments, the index field 1654 is supplemented with an additional bit from a prefix (e.g., prefix 1501) to allow for greater addressing. The base field 1656 specifies a base register to use. In some embodiments, the base field 1656 is supplemented with an additional bit from a prefix (e.g., prefix 1501) to allow for greater addressing. In practice, the content of the scale field 1652 allows for the scaling of the content of the index field 1654 for memory address generation (e.g., for address generation that uses $2^{scale}*index+base$).

Some addressing forms utilize a displacement value to generate a memory address. For example, a memory address may be generated according to $2^{scale}*index+base+displacement$, index*scale+displacement, r/m+displacement, instruction pointer (RIP/EIP)+displacement, register+displacement, etc. The displacement may be a 1-byte, 2-byte, 4-byte, etc. value. In some embodiments, a displacement field 1507 provides this value. Additionally, in some embodiments, a displacement factor usage is encoded in the MOD field of the addressing field 1505 that indicates a compressed displacement scheme for which a displacement value is calculated by multiplying disp8 in conjunction with a scaling factor N that is determined based on the vector length, the value of a b bit, and the input element size of the instruction. The displacement value is stored in the displacement field 1507.

In some embodiments, an immediate field 1509 specifies an immediate for the instruction. An immediate may be encoded as a 1-byte value, a 2-byte value, a 4-byte value, etc.

FIG. 17 illustrates embodiments of a first prefix 1501(A). In some embodiments, the first prefix 1501(A) is an embodiment of a REX prefix. Instructions that use this prefix may specify general purpose registers, 64-bit packed data registers (e.g., single instruction, multiple data (SIMD) registers or vector registers), and/or control registers and debug registers (e.g., CR8-CR15 and DR8-DR15).

Instructions using the first prefix 1501(A) may specify up to three registers using 3-bit fields depending on the format: 1) using the reg field 1644 and the R/M field 1646 of the Mod R/M byte 1602; 2) using the Mod R/M byte 1602 with the SIB byte 1604 including using the reg field 1644 and the base field 1656 and index field 1654; or 3) using the register field of an opcode.

In the first prefix 1501(A), bit positions 7:4 are set as 0100. Bit position 3 (W) can be used to determine the operand size, but may not solely determine operand width. As such, when W=0, the operand size is determined by a code segment descriptor (CS.D) and when W=1, the operand size is 64-bit.

Note that the addition of another bit allows for 16 ($2^4$) registers to be addressed, whereas the MOD R/M reg field 1644 and MOD R/M R/M field 1646 alone can each only address 8 registers.

In the first prefix 1501(A), bit position 2 (R) may an extension of the MOD R/M reg field 1644 and may be used to modify the ModR/M reg field 1644 when that field encodes a general purpose register, a 64-bit packed data register (e.g., a SSE register), or a control or debug register. R is ignored when Mod R/M byte 1602 specifies other registers or defines an extended opcode.

Bit position 1 (X) X bit may modify the SIB byte index field 1654.

Bit position B (B) B may modify the base in the Mod R/M R/M field 1646 or the SIB byte base field 1656; or it may modify the opcode register field used for accessing general purpose registers (e.g., general purpose registers 1425).

FIGS. 18(A)-(D) illustrate embodiments of how the R, X, and B fields of the first prefix 1501(A) are used. FIG. 18(A) illustrates R and B from the first prefix 1501(A) being used to extend the reg field 1644 and R/M field 1646 of the MOD R/M byte 1602 when the SIB byte 1604 is not used for memory addressing. FIG. 18(B) illustrates R and B from the first prefix 1501(A) being used to extend the reg field 1644 and R/M field 1646 of the MOD R/M byte 1602 when the SIB byte 1604 is not used (register-register addressing). FIG. 18(C) illustrates R, X, and B from the first prefix 1501(A) being used to extend the reg field 1644 of the MOD R/M byte 1602 and the index field 1654 and base field 1656 when the SIB byte 1604 being used for memory addressing. FIG. 18(D) illustrates B from the first prefix 1501(A) being used to extend the reg field 1644 of the MOD R/M byte 1602 when a register is encoded in the opcode 1503.

Figure 19A:
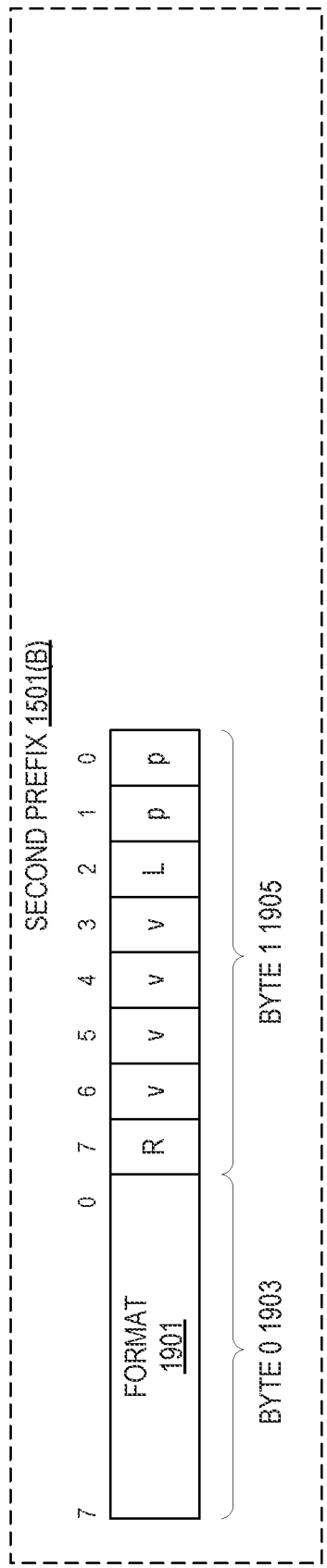
FIGS. 19(A)-(B) illustrate embodiments of a second prefix
Figure 19B:
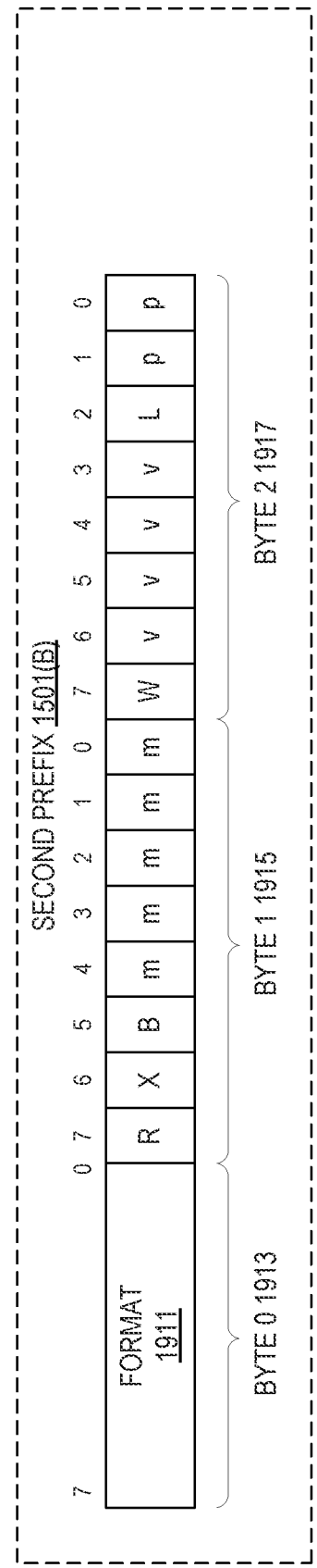

FIGS. 19(A)-(B) illustrate embodiments of a second prefix 1501(B). In some embodiments, the second prefix 1501(B) is an embodiment of a VEX prefix. The second prefix 1501(B) encoding allows instructions to have more than two operands, and allows SIMD vector registers (e.g., vector/SIMD registers 1410) to be longer than 64-bits (e.g., 128-bit and 256-bit). The use of the second prefix 1501(B) provides for three-operand (or more) syntax. For example, previous two-operand instructions performed operations such as A=A+B, which overwrites a source operand. The use of the second prefix 1501(B) enables operands to perform nondestructive operations such as A=B+C.

In some embodiments, the second prefix 1501(B) comes in two forms—a two-byte form and a three-byte form. The two-byte second prefix 1501(B) is used mainly for 128-bit, scalar, and some 256-bit instructions; while the three-byte second prefix 1501(B) provides a compact replacement of the first prefix 1501(A) and 3-byte opcode instructions.

FIG. 19(A) illustrates embodiments of a two-byte form of the second prefix 1501(B). In one example, a format field 1901 (byte 0 1903) contains the value C5H. In one example, byte 1 1905 includes a "R" value in bit[7]. This value is the complement of the same value of the first prefix 1501(A). Bit[2] is used to dictate the length (L) of the vector (where a value of 0 is a scalar or 128-bit vector and a value of 1 is a 256-bit vector). Bits[1:0] provide opcode extensionality equivalent to some legacy prefixes (e.g., 00=no prefix, 01=66H, 10=F3H, and 11=F2H). Bits[6:3] shown as vvvv may be used to: 1) encode the first source register operand, specified in inverted (1s complement) form and valid for instructions with 2 or more source operands; 2) encode the destination register operand, specified in 1s complement form for certain vector shifts; or 3) not encode any operand, the field is reserved and should contain a certain value, such as 1111b.

Instructions that use this prefix may use the Mod R/M R/M field 1646 to encode the instruction operand that references a memory address or encode either the destination register operand or a source register operand.

Instructions that use this prefix may use the Mod R/M reg field 1644 to encode either the destination register operand or a source register operand, be treated as an opcode extension and not used to encode any instruction operand.

For instruction syntax that support four operands, vvvv, the Mod R/M R/M field 1646 and the Mod R/M reg field 1644 encode three of the four operands. Bits[7:4] of the immediate 1509 are then used to encode the third source register operand.

FIG. 19(B) illustrates embodiments of a three-byte form of the second prefix 1501(B). in one example, a format field 1911 (byte 0 1913) contains the value C4H. Byte 1 1915 includes in bits[7:5] "R," "X," and "B" which are the complements of the same values of the first prefix 1501(A). Bits[4:0] of byte 1 1915 (shown as mmmmm) include content to encode, as need, one or more implied leading opcode bytes. For example, 00001 implies a 0FH leading opcode, 00010 implies a 0F38H leading opcode, 00011 implies a leading 0F3AH opcode, etc.

Bit[7] of byte 2 1917 is used similar to W of the first prefix 1501(A) including helping to determine promotable operand sizes. Bit[2] is used to dictate the length (L) of the vector (where a value of 0 is a scalar or 128-bit vector and a value of 1 is a 256-bit vector). Bits[1:0] provide opcode extensionality equivalent to some legacy prefixes (e.g., 00=no prefix, 01=66H, 10=F3H, and 11=F2H). Bits[6:3], shown as vvvv, may be used to: 1) encode the first source register operand, specified in inverted (1s complement) form and valid for instructions with 2 or more source operands; 2) encode the destination register operand, specified in 1s complement form for certain vector shifts; or 3) not encode any operand, the field is reserved and should contain a certain value, such as 1111b.

Instructions that use this prefix may use the Mod R/M R/M field 1646 to encode the instruction operand that references a memory address or encode either the destination register operand or a source register operand.

Instructions that use this prefix may use the Mod R/M reg field 1644 to encode either the destination register operand or a source register operand, be treated as an opcode extension and not used to encode any instruction operand.

For instruction syntax that support four operands, vvvv, the Mod R/M R/M field 1646, and the Mod R/M reg field 1644 encode three of the four operands. Bits[7:4] of the immediate 1509 are then used to encode the third source register operand.

Figure 20:
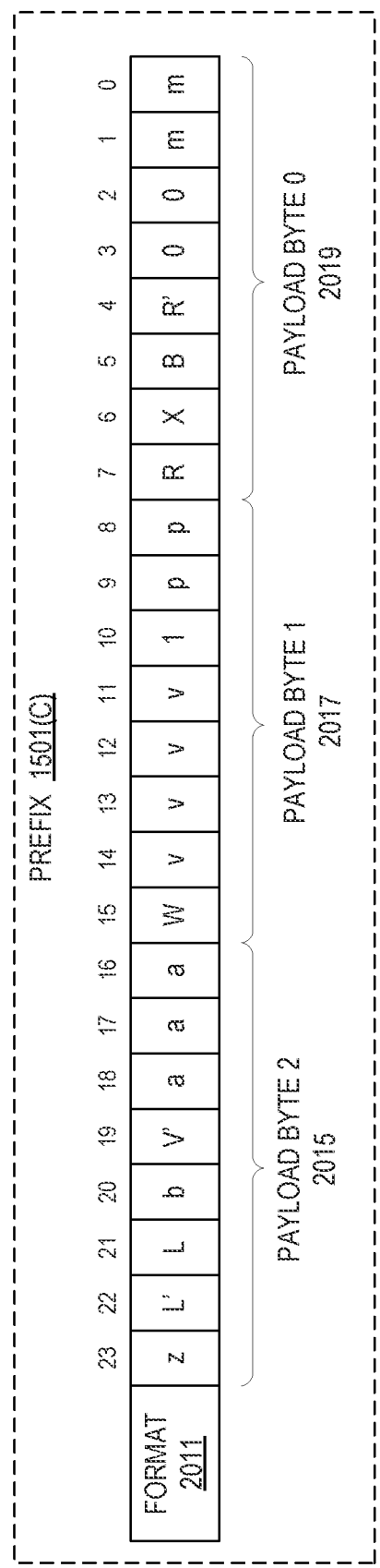
FIG. 20 illustrates embodiments of a third prefix.

FIG. 20 illustrates embodiments of a third prefix 1501(C). In some embodiments, the first prefix 1501(A) is an embodiment of an EVEX prefix. The third prefix 1501(C) is a four-byte prefix.

The third prefix 1501(C) can encode 32 vector registers (e.g., 128-bit, 256-bit, and 512-bit registers) in 64-bit mode. In some embodiments, instructions that utilize a writemask/opmask (see discussion of registers in a previous figure, such as FIG. 14) or predication utilize this prefix. Opmask register allow for conditional processing or selection control. Opmask instructions, whose source/destination operands are opmask registers and treat the content of an opmask register as a single value, are encoded using the second prefix 1501(B).

The third prefix 1501(C) may encode functionality that is specific to instruction classes (e.g., a packed instruction with "load+op" semantic can support embedded broadcast functionality, a floating-point instruction with rounding semantic can support static rounding functionality, a floating-point instruction with non-rounding arithmetic semantic can support "suppress all exceptions" functionality, etc.).

The first byte of the third prefix 1501(C) is a format field 2011 that has a value, in one example, of 62H. Subsequent bytes are referred to as payload bytes 2015-2019 and collectively form a 24-bit value of P[23:0] providing specific capability in the form of one or more fields (detailed herein).

In some embodiments, P[1:0] of payload byte 2019 are identical to the low two mmmmm bits. P[3:2] are reserved in some embodiments. Bit P[4] (R') allows access to the high 16 vector register set when combined with P[7] and the ModR/M reg field 1644. P[6] can also provide access to a high 16 vector register when SIB-type addressing is not needed. P[7:5] consist of an R, X, and B which are operand specifier modifier bits for vector register, general purpose register, memory addressing and allow access to the next set of 8 registers beyond the low 8 registers when combined with the ModR/M register field 1644 and ModR/M R/M field 1646. P[9:8] provide opcode extensionality equivalent to some legacy prefixes (e.g., 00=no prefix, 01=66H, 10=F3H, and 11=F2H). P[10] in some embodiments is a fixed value of 1. P[14:11], shown as vvvv, may be used to: 1) encode the first source register operand, specified in inverted (1s complement) form and valid for instructions with 2 or more source operands; 2) encode the destination register operand, specified in 1s complement form for certain vector shifts; or 3) not encode any operand, the field is reserved and should contain a certain value, such as 1111b.

P[15] is similar to W of the first prefix 1501(A) and second prefix 1511(B) and may serve as an opcode extension bit or operand size promotion.

P[18:16] specify the index of a register in the opmask (writemask) registers (e.g., writemask/predicate registers 1415). In one embodiment of the invention, the specific value aaa=000 has a special behavior implying no opmask is used for the particular instruction (this may be implemented in a variety of ways including the use of a opmask hardwired to all ones or hardware that bypasses the masking hardware). When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the opmask field allows for partial vector operations, including loads, stores, arithmetic, logical, etc. While embodiments of the invention are described in which the opmask field's content selects one of a number of opmask registers that contains the opmask to be used (and thus the opmask field's content indirectly identifies that masking to be performed), alternative embodiments instead or additional allow the mask write field's content to directly specify the masking to be performed.

P[19] can be combined with P[14:11] to encode a second source vector register in a non-destructive source syntax which can access an upper 16 vector registers using P[19]. P[20] encodes multiple functionalities, which differs across different classes of instructions and can affect the meaning of the vector length/rounding control specifier field (P[22:21]). P[23] indicates support for merging-writemasking (e.g., when set to 0) or support for zeroing and merging-writemasking (e.g., when set to 1).

Exemplary embodiments of encoding of registers in instructions using the third prefix 1501(C) are detailed in the following tables.

TABLE 1

32-Register Support in 64-bit Mode

| | 4 | 3 | [2:0] | REG. TYPE | COMMON USAGES |
|---|---|---|---|---|---|
| REG | R' | R | ModR/M reg | GPR, Vector | Destination or Source |
| VVVV | V' | | vvvv | GPR, Vector | 2nd Source or Destination |
| RM | X | B | ModR/M R/M | GPR, Vector | 1st Source or Destination |
| BASE | 0 | B | ModR/M R/M | GPR | Memory addressing |
| INDEX | 0 | X | SIB.index | GPR | Memory addressing |
| VIDX | V' | X | SIB.index | Vector | VSIB memory addressing |

TABLE 2

Encoding Register Specifiers in 32-bit Mode

| | [2:0] | REG. TYPE | COMMON USAGES |
|---|---|---|---|
| REG | ModR/M reg | GPR, Vector | Destination or Source |
| VVVV | vvvv | GPR, Vector | $2^{nd}$ Source or Destination |
| RM | ModR/M R/M | GPR, Vector | $1^{st}$ Source or Destination |
| BASE | ModR/M R/M | GPR | Memory addressing |
| INDEX | SIB.index | GPR | Memory addressing |
| VIDX | SIB.index | Vector | VSIB memory addressing |

TABLE 3

Opmask Register Specifier Encoding

| | [2:0] | REG. TYPE | COMMON USAGES |
|---|---|---|---|
| REG | ModR/M Reg | k0-k7 | Source |
| VVVV | vvvv | k0-k7 | $2^{nd}$ Source |
| RM | ModR/M R/M | k0-7 | $1^{st}$ Source |
| {k1} | aaa | k0[1]-k7 | Opmask |

Program code may be applied to input instructions to perform the functions described herein and generate output information. The output information may be applied to one or more output devices, in known fashion. For purposes of this application, a processing system includes any system that has a processor, such as, for example, a digital signal processor (DSP), a microcontroller, an application specific integrated circuit (ASIC), or a microprocessor.

The program code may be implemented in a high-level procedural or object-oriented programming language to communicate with a processing system. The program code may also be implemented in assembly or machine language, if desired. In fact, the mechanisms described herein are not limited in scope to any particular programming language. In any case, the language may be a compiled or interpreted language.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 21 illustrates a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 21 shows a program in a high level language 2102 may be compiled using a first ISA compiler 2104 to generate first ISA binary code 2106 that may be natively executed by a processor with at least one first instruction set core 2116. The processor with at least one first ISA instruction set core 2116 represents any processor that can perform substantially the same functions as an Intel® processor with at least one first ISA instruction set core by compatibly executing or otherwise processing (1) a substantial portion of the instruction set of the first ISA instruction set core or (2) object code versions of applications or other software targeted to run on an Intel processor with at least one first ISA instruction set core, in order to achieve substantially the same result as a processor with at least one first ISA instruction set core. The first ISA compiler 2104 represents a compiler that is operable to generate first ISA binary code 2106 (e.g., object code) that can, with or without additional linkage processing, be executed on the processor with at least one first ISA instruction set core 2116. Similarly, FIG. 21 shows the program in the high level language 2102 may be compiled using an alternative instruction set compiler 2108 to generate alternative instruction set binary code 2110 that may be natively executed by a processor without a first ISA instruction set core 2114. The instruction converter 2112 is used to convert the first ISA binary code 2106 into code that may be natively executed by the processor without a first ISA instruction set core 2114. This converted code is not likely to be the same as the alternative instruction set binary code 2110 because an instruction converter capable of this is difficult to make; however, the converted code will accomplish the general operation and be made up of instructions from the alternative instruction set. Thus, the instruction converter 2112 represents software, firmware, hardware, or a combination thereof that, through emulation, simulation or any other process, allows a processor or other electronic device that does not have a first ISA instruction set processor or core to execute the first ISA binary code 2106.

Exemplary embodiments include, but are not limited to:
1. An apparatus comprising:
   decoder circuitry to decode a single instruction, the single instruction to include one or more fields to identify a source operand, one or more fields to identify a destination operand, and one or more fields for an opcode, the opcode to indicate that execution circuitry is to convert packed half-precision floating-point data from the identified source to packed bfloat8 data and store the packed bfloat8 data into corresponding data element positions of the identified destination operand; and
   execution circuitry to execute the decoded instruction according to the opcode to convert packed half-precision floating-point data from the identified source to packed bfloat8 data and store the packed bfloat8 data into corresponding data element positions of the identified destination operand.
2. The apparatus of example 1, wherein the field for the identifier of the first source operand is to identify a vector register.
3. The apparatus of example 1, wherein the field for the identifier of the first source operand is to identify a memory location.
4. The apparatus of example 1, wherein when a half-precision floating-point data value is infinite, the bfloat8 data value is set to be bits 15:8 of the half-precision floating-point data value.
5. The apparatus of example 1, wherein when a half-precision floating-point data value is non-a-number, the bfloat8 data value has bits 7:2 set to be bits 15:10 of the half-precision floating-point data value, bit 1 set to be 1, and bit 0 set to be bit 8 of the half-precision floating-point data value.

6. The apparatus of example 1, wherein when a half-precision floating-point data value is non-a-number, the bfloat8 data value is to be computed by setting a first temporary value to be a value of a bit 8 of the half-precision floating-point data value, a rounding bias is set to be 0x0007 plus the first temporary value, a second temporary value is set to bit bits 15:0 of the half-precision floating-point data value plus the rounding bias, and the bfloat8 data value is set to be bits 15:8 of the second temporary value.

7. The apparatus of example 1, wherein the single instruction is further to include one or more fields to identify a write-mask operand, wherein one or more bits of the writemask operand are to indicate to execution circuitry which of the converted bfloat8 data values are to be written in the destination operand.

8. A method comprising:
   decoding a single instruction, the single instruction to include one or more fields to identify a source operand, one or more fields to identify a destination operand, and one or more fields for an opcode, the opcode to indicate that execution circuitry is to convert packed half-precision floating-point data from the identified source to packed bfloat8 data and store the packed bfloat8 data into corresponding data element positions of the identified destination operand; and
   executing the decoded instruction according to the opcode to convert packed half-precision floating-point data from the identified source to packed bfloat8 data and store the packed bfloat8 data into corresponding data element positions of the identified destination operand.

9. The method of example 8, wherein the field for the identifier of the first source operand is to identify a vector register.

10. The method of example 8, wherein the field for the identifier of the first source operand is to identify a memory location.

11. The method of example 8, wherein when a half-precision floating-point data value is infinite, the bfloat8 data value is set to be bits 15:8 of the half-precision floating-point data value.

12. The method of example 8, wherein when a half-precision floating-point data value is non-a-number, the bfloat8 data value has bits 7:2 set to be bits 15:10 of the half-precision floating-point data value, bit 1 set to be 1, and bit 0 set to be bit 8 of the half-precision floating-point data value.

13. The method of example 8, wherein when a half-precision floating-point data value is non-a-number, the bfloat8 data value is to be computed by setting a first temporary value to be a value of a bit 8 of the half-precision floating-point data value, a rounding bias is set to be 0x0007 plus the first temporary value, a second temporary value is set to bit bits 15:0 of the half-precision floating-point data value plus the rounding bias, and the bfloat8 data value is set to be bits 15:8 of the second temporary value.

14. The method of example 8, wherein the single instruction is further to include one or more fields to identify a write-mask operand, wherein one or more bits of the writemask operand are to indicate to execution circuitry which of the converted bfloat8 data values are to be written in the destination operand.

15. The method of example 8, further comprising translating the single instruction into one or more instructions of a different instruction set architecture prior to decoding, wherein executing of the one or more instructions of the different instruction set architecture is to be functionally equivalent as the executing according to the opcode of the single instruction.

16. A non-transitory machine-readable medium storing an instance of a single instruction that includes one or more fields to identify a source operand, one or more fields to identify a destination operand, and one or more fields for an opcode, the opcode to indicate that execution circuitry is to convert packed half-precision floating-point data from the identified source to packed bfloat8 data and store the packed bfloat8 data into corresponding data element positions of the identified destination operand, wherein the instance of the single instruction is to be handled by a processor by performing a method, the method comprising:
   decoding the single instruction; and
   executing the decoded instruction according to the opcode to convert packed half-precision floating-point data from the identified source to packed bfloat8 data and store the packed bfloat8 data into corresponding data element positions of the identified destination operand.

17. The non-transitory machine-readable medium of example 16, wherein when a half-precision floating-point data value is infinite, the bfloat8 data value is set to be bits 15:8 of the half-precision floating-point data value.

18. The non-transitory machine-readable medium of example 16, wherein when a half-precision floating-point data value is non-a-number, the bfloat8 data value has bits 7:2 set to be bits 15:10 of the half-precision floating-point data value, bit 1 set to be 1, and bit 0 set to be bit 8 of the half-precision floating-point data value.

19. The non-transitory machine-readable medium of example 16, wherein when a half-precision floating-point data value is non-a-number, the bfloat8 data value is to be computed by setting a first temporary value to be a value of a bit 8 of the half-precision floating-point data value, a rounding bias is set to be 0x0007 plus the first temporary value, a second temporary value is set to bit bits 15:0 of the half-precision floating-point data value plus the rounding bias, and the bfloat8 data value is set to be bits 15:8 of the second temporary value.

20. The non-transitory machine-readable medium of example 16, wherein the field for the identifier of the first source operand is to identify a vector register.

References to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Moreover, in the various embodiments described above, unless specifically noted otherwise, disjunctive language such as the phrase "at least one of A, B, or C" is intended to be understood to mean either A, B, or C, or any combination thereof (e.g., A, B, and/or C). As such, disjunctive language is not intended to, nor should it be understood to, imply that a given embodiment requires at least one of A, at least one of B, or at least one of C to each be present.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

What is claimed is:

1. An apparatus comprising:
a plurality of memory controllers;
a level-two (L2) cache memory coupled to the plurality of memory controllers;
a processor coupled to the plurality of memory controllers, and coupled to the L2 cache memory, the processor having a plurality of cores and a plurality of levels of cache memory, the cores including circuitry to perform operations corresponding to an instruction, the instruction to identify a source register that is to include a plurality of half-precision floating-point data elements and to identify a destination register, wherein the half-precision floating-point data elements are 16-bit data elements, the operations including to:
convert the plurality of half-precision floating-point data elements to a plurality of corresponding 8-bit floating-point data elements, wherein, when one or more of the half-precision floating-point data elements are normal numbers, conversion of the one or more normal numbers to one or more corresponding 8-bit floating-point data elements is to be performed according to a round to nearest even rounding mode, and the one or more corresponding 8-bit floating-point data elements are each to include one sign bit, five exponent bits, and two mantissa bits, wherein for each normal half-precision floating-point data element, a corresponding 8-bit floating-point data element is to be converted from the half-precision floating point data element using a rounding bias; and
store the plurality of 8-bit floating-point data elements in the destination register;
an interconnect interface coupled to the processor; and
a bus controller interface coupled to the processor.

2. The apparatus of claim 1, wherein the instruction allows only the round to nearest even rounding mode for the conversion of the one or more normal numbers to the one or more corresponding 8-bit floating-point data elements.

3. The apparatus of claim 1, wherein the cores comprise graphics cores.

4. The apparatus of claim 1, wherein the cores comprise heterogeneous cores.

5. The apparatus of claim 1, wherein the cores comprise heterogeneous graphics cores.

6. The apparatus of claim 1, further comprising an instruction converter to convert the instruction into one or more instructions of a different instruction set executable by the cores.

7. The apparatus of claim 1, wherein, when one or more of the half-precision floating-point data elements are not-a-number (NaN) data elements, conversion of the one or more NaN data elements is to include setting a most significant bit of a mantissa of each of one or more corresponding 8-bit floating-point data elements.

8. The apparatus of claim 1, wherein, when one or more of the half-precision floating-point data elements are not-a-number (NaN) data elements, conversion of the one or more NaN data elements is to include modifying a bit of a mantissa of each of one or more corresponding 8-bit floating-point data elements.

9. The apparatus of claim 1, wherein, when one or more of the half-precision floating-point data elements are not-a-number (NaN) data elements, conversion of the one or more NaN data elements is to include forcing quiet NAN (QNAN) for each of one or more corresponding 8-bit floating-point data elements.

10. An apparatus comprising:
circuitry to receive an instruction, the instruction to identify a source register that is to include a plurality of half-precision floating-point data elements and to identify a destination register, wherein the half-precision floating-point data elements are 16-bit data elements;
a plurality of memory controllers;
a level-two (L2) cache memory coupled to the plurality of memory controllers;
execution circuitry to perform operations corresponding to the instruction, including to:
convert the plurality of half-precision floating-point data elements to a plurality of corresponding 8-bit floating-point data elements, wherein, when one or more of the half-precision floating-point data elements are normal numbers, conversion of the one or more normal numbers to one or more corresponding 8-bit floating-point data elements is to be performed according to a round to nearest even rounding mode, and the one or more corresponding 8-bit floating-point data elements are each to include one sign bit, five exponent bits, and two mantissa bits, wherein, when one or more of the half-precision floating-point data elements are not-a-number (NaN) data elements, conversion of the one or more NaN data elements is to include truncating a most significant 8 bits of the half-precision floating-point data element and setting a most significant bit of a mantissa of each of one or more corresponding 8-bit floating-point data elements, wherein for each normal half-precision floating-point data element, a corresponding 8-bit floating-point data element is to be converted from the half-precision floating point data element using a rounding bias; and
store the plurality of 8-bit floating-point data elements in the destination register;
an interconnect interface coupled to the execution circuitry; and
a bus controller interface coupled to the execution circuitry.

11. The apparatus of claim 10, wherein the instruction allows only the round to nearest even rounding mode for the conversion of the one or more normal numbers to the one or more corresponding 8-bit floating-point data elements.

12. The apparatus of claim 10, wherein the execution circuitry is within a graphics core.

13. The apparatus of claim 10, further comprising an instruction converter to convert the instruction into one or more instructions of a different instruction set executable by the execution circuitry.

14. An apparatus comprising:
an instruction converter to convert a first instruction into one or more other instructions, the first instruction to identify a source register that is to include a plurality of half-precision floating-point data elements and to identify a destination register, wherein the half-precision floating-point data elements are 16-bit data elements;
a plurality of memory controllers;
a level-two (L2) cache memory coupled to the plurality of memory controllers;
execution circuitry to perform operations corresponding to the first instruction, including to:
convert the plurality of half-precision floating-point data elements to a plurality of corresponding 8-bit floating-point data elements, wherein, when one or more of the half-precision floating-point data elements are normal numbers, conversion of the one or more normal numbers to one or more corresponding 8-bit floating-point data elements is to be performed according to a round to nearest even rounding mode, and the one or more corresponding 8-bit floating-point data elements are each to include one sign bit, five exponent bits, and two mantissa bits, wherein for each normal half-precision floating-point data element, a corresponding 8-bit floating-point data element is to be converted from the half-precision floating point data element using a rounding bias; and store the plurality of 8-bit floating-point data elements in the destination register;

an interconnect interface coupled to the execution circuitry; and a bus controller interface coupled to the execution circuitry.

15. The apparatus of claim 14, wherein the first instruction allows only the round to nearest even rounding mode for the conversion of the one or more normal numbers to the one or more corresponding 8-bit floating-point data elements.

16. The apparatus of claim 14, wherein, when one or more of the half-precision floating-point data elements are not-a-number (NaN) data elements, conversion of the one or more NaN data elements is to include modifying a bit of a mantissa of each of one or more corresponding 8-bit floating-point data elements.

17. The apparatus of claim 14, wherein, when one or more of the half-precision floating-point data elements are not-a-number (NaN) data elements, conversion of the one or more NaN data elements is to include forcing quiet NAN (QNAN) for each of one or more corresponding 8-bit floating-point data elements.

18. The apparatus of claim 14, wherein the execution circuitry is part of a graphics core.

* * * * *